(12) United States Patent
Ko

(10) Patent No.: US 11,719,747 B2
(45) Date of Patent: *Aug. 8, 2023

(54) EMBEDDED LOGIC ANALYZER AND INTEGRATED CIRCUIT INCLUDING THE SAME

(71) Applicant: Samsung Electronics Co., Ltd., Suwon-si (KR)

(72) Inventor: Joon-Won Ko, Seoul (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 231 days.

This patent is subject to a terminal disclaimer.

(21) Appl. No.: 17/337,517

(22) Filed: Jun. 3, 2021

(65) Prior Publication Data

US 2021/0286001 A1 Sep. 16, 2021

Related U.S. Application Data

(63) Continuation of application No. 15/170,020, filed on Jun. 1, 2016, now Pat. No. 11,029,357.

(30) Foreign Application Priority Data

Aug. 13, 2015 (KR) .......................... 10-2015-0114422

(51) Int. Cl.
*G01R 31/317* (2006.01)
*H03K 19/173* (2006.01)
(Continued)

(52) U.S. Cl.
CPC ... *G01R 31/31705* (2013.01); *G01R 31/3177* (2013.01); *H03K 5/26* (2013.01); *H03K 19/1737* (2013.01); *H03K 19/17764* (2013.01)

(58) Field of Classification Search
CPC .......... G01R 31/31705; G01R 31/3177; H03K 5/26; H03K 19/1737; H03K 19/17764
See application file for complete search history.

(56) References Cited

U.S. PATENT DOCUMENTS 6,704,889 B2   3/2004   Veenstra et al.
7,536,615 B1   5/2009   Pierce et al.
(Continued)

FOREIGN PATENT DOCUMENTS

CN         1306639 A      8/2001
CN       101334440 A     12/2008
(Continued)

OTHER PUBLICATIONS

Office Action for Corresponding Chinese Patent Application No. 201610670876.6 dated Jan. 6, 2020.

*Primary Examiner* — April Y Blair
*Assistant Examiner* — Rong Tang
(74) *Attorney, Agent, or Firm* — Harness, Dickey & Pierce, P.L.C.

(57) ABSTRACT

An embedded logic analyzer of an integrated circuit includes a comparison block configured to generate a capture data signal and a plurality of comparison enable signals based on an input data signal from one of function blocks included in the integrated circuit such that the comparison enable signals are activated respectively based on different comparison conditions; an operation block configured to perform a logic operation on the comparison enable signals to generate a data enable signal indicating a data capture timing; and packer circuitry configured to generate a packer data signal including capture data and capture time information based on the capture data signal, the data enable signal and a time information signal.

19 Claims, 23 Drawing Sheets

(51) Int. Cl.
  *H03K 19/17764*  (2020.01)
  *H03K 5/26*  (2006.01)
  *G01R 31/3177*  (2006.01)

(56) References Cited

U.S. PATENT DOCUMENTS

| | | |
|---|---|---|
| 7,746,183 B2 | 6/2010 | Kim et al. |
| 8,745,455 B2 | 6/2014 | Ramirez et al. |
| 8,914,681 B2 | 12/2014 | Bailey |
| 10,078,113 B1 | 9/2018 | Usgaonkar et al. |
| 2002/0013893 A1 | 1/2002 | Roy et al. |
| 2005/0257109 A1 | 11/2005 | Averbuj et al. |
| 2006/0156065 A1 | 7/2006 | Glass |
| 2006/0156290 A1 | 7/2006 | Johnson et al. |
| 2012/0131404 A1 | 5/2012 | Ramirez et al. |
| 2015/0278418 A1 | 10/2015 | Kodavalla |

FOREIGN PATENT DOCUMENTS

| | | |
|---|---|---|
| JP | H09-5401 A | 1/1997 |
| JP | H09-80079 A | 3/1997 |
| JP | H10-283217 A | 10/1998 |
| JP | 2006047076 A | 2/2006 |
| JP | 2006337128 A | 12/2006 |
| KR | 20000001364 A | 1/2000 |

FIG. 17B

| | 63 | | | | | | | 0 | |
|---|---|---|---|---|---|---|---|---|---|
| t1 | D0 | D0 | D0 | D0 | D0 | D0 | D0 | D0 | |
| t2 | D1 | D1 | D1 | D1 | D1 | D1 | D1 | D1 | |
| t3 | D2 | D2 | D2 | D2 | D2 | D2 | D2 | D2 | |
| t4 | D3 | D3 | D3 | D3 | D3 | D3 | D3 | D3 | |
| t5 | T3 | T3 | T2 | T2 | T1 | T1 | T0 | T0 | |
| t6 | D4 | D4 | D4 | D4 | D4 | D4 | D4 | D4 | |
| t7 | D5 | D5 | D5 | D5 | D5 | D5 | D5 | D5 | |
| t8 | D6 | D6 | D6 | D6 | D6 | D6 | D6 | D6 | |
| t9 | D7 | D7 | D7 | D7 | D7 | D7 | D7 | D7 | |
| t10 | T7 | T7 | T6 | T6 | T5 | T5 | T4 | T4 | ↓ TIME |

FIG. 17C

| | 63 | | | | | | | 0 | |
|---|---|---|---|---|---|---|---|---|---|
| t1 | D0 | D0 | D0 | D0 | D0 | D0 | D0 | D0 | |
| t2 | D1 | D1 | D1 | D1 | D1 | D1 | D1 | D1 | |
| t3 | D2 | D2 | D2 | D2 | D2 | D2 | D2 | D2 | |
| t4 | D3 | D3 | D3 | D3 | D3 | D3 | D3 | D3 | |
| t5 | D4 | D4 | D4 | D4 | D4 | D4 | D4 | D4 | |
| t6 | D5 | D5 | D5 | D5 | D5 | D5 | D5 | D5 | |
| t7 | D6 | D6 | D6 | D6 | D6 | D6 | D6 | D6 | |
| t8 | D7 | D7 | D7 | D7 | D7 | D7 | D7 | D7 | |
| t9 | T7 | T6 | T5 | T4 | T3 | T2 | T1 | T0 | ↓ TIME |

| | 63 | | | | | | | 0 |
|---|---|---|---|---|---|---|---|---|
| DBa | D07 | D06 | D05 | D04 | D03 | D02 | D01 | D00 |
| DBb | D13 | D12 | D11 | D10 | D03 | D02 | D01 | D00 |
| DBc | D31 | D30 | D21 | D20 | D11 | D10 | D01 | D00 |
| DBd | D70 | D60 | D50 | D40 | D30 | D20 | D10 | D00 |

EMBEDDED LOGIC ANALYZER AND INTEGRATED CIRCUIT INCLUDING THE SAME

CROSS-REFERENCE TO RELATED APPLICATION

This is a continuation of U.S. application Ser. No. 15/170,020, filed Jun. 1, 2016, which claims priority to Korean Application No. 10-2015-0114422, filed on Aug. 13, 2015, the disclosures of each of which are hereby incorporated by reference in their entirety.

BACKGROUND

1. Technical Field

Example embodiments relate generally to semiconductor integrated circuits, and more particularly to an embedded logic analyzer and an integrated circuit including the embedded logic analyzer.

2. Discussion of the Related Art

When a developed integrated circuit works abnormally, a debugging process is performed to search and solve the problem. Function blocks such as a central processing unit (CPU), a digital signal processor (DSP), etc., which are connected to a main bus, may be debugged using Joint Test Action Group (JTAG) architecture, etc. To debug circuits such as an internal logic of a modem block that is not connected directly to the main bus, internal signals have to be extracted to an external device to analyze the internal signals. Chip size is increased and productivity is degraded because many input-output pins are assigned to extract the internal signals.

SUMMARY

At least one example embodiment of the present disclosure may provide an embedded logic analyzer capable of efficiently providing internal logic signals for debugging.

At least one example embodiment of the present disclosure may provide an integrated circuit including an embedded logic analyzer capable of efficiently providing internal logic signals for debugging.

According to at least some example embodiments, an embedded logic analyzer of an integrated circuit includes a comparison block configured to generate a capture data signal and a plurality of comparison enable signals based on an input data signal from one of function blocks included in the integrated circuit such that the comparison enable signals are activated respectively based on different comparison conditions; an operation block configured to perform a logic operation on the comparison enable signals to generate a data enable signal indicating a data capture timing; and packer circuitry configured to generate a packer data signal including capture data and capture time information based on the capture data signal, the data enable signal and a time information signal.

The embedded logic analyzer may further include a main controller configured to generate comparison control signals indicating the comparison conditions, operation control signals controlling the logic operation of the operation block, and packer control signals controlling an operation of the packer circuitry.

The comparison block may include a plurality of comparison circuits, each comparison circuit configured to generate an enable signal from among the comparison enable signals based on the input data signal and a control signal from among comparison control signals indicating the comparison conditions.

At least a first comparison circuit of the plurality of comparison circuits may be configured to shift the input data signal to generate a shift data signal and configured to compare the shift data signal with a reference data signal to generate the enable signal generated by the first comparison circuit.

At least a first comparison circuit of the plurality of comparison circuits may be configured to shift one of the input data signal and a first shift data signal from a second comparison circuit of the plurality of comparison circuits to generate a second shift data signal, and compare the second shift data signal with one of a reference data signal and a third shift data signal from a third comparison circuit of the plurality of comparison circuits to generate the enable signal generated by the first comparison circuit.

At least a first comparison circuit of the plurality of comparison circuits may include a first shift register configured to shift the input data signal to the left in response to first bits of a shift control signal, the first bits representing a left shift number; a second shift register configured to shift an output signal of the first shift register to the right in response to second bits of the shift control signal, the second bits representing a right shift number; and a comparator configured to compare an output signal of the second shift register with a reference data signal in response to third bits of the shift control signal to generate the enable signal generated by the first comparison circuit, the third bits representing a comparison bit number.

The comparison block may further include a multiplexer configured to select a signal from among the input data signal and shift data signals generated by the plurality of comparison circuits and output the selected signal as the capture data signal.

The operation block may further include first operation circuitry configured to generate a start trigger enable signal based on the comparison enable signals and a start trigger control signal; second operation circuitry configured to generate an end trigger enable signal based on the comparison enable signals and an end trigger control signal; and third operation circuitry configured to generate a write enable signal based on the comparison enable signals and a write enable control signal.

Each of the first operation circuitry, the second operation circuitry and the third operation circuitry may include a plurality of multiplexers configured to output first selected signals selected from among the comparison enable signals such that the first selected signals correspond to a portion of the comparison enable signals, in response to each of the start trigger control signal, the end trigger control signal and the write enable control signal; and operator circuitry configured to perform a logic operation on the first selected signals in response to each of the start trigger control signal, the end trigger control signal and the write enable control signal to generate each of the start trigger enable signal, the end trigger enable signal and the write enable signal.

The operation block may further include a time controller configured to generate a write-on signal indicating start and end time points of data capture duration in response to the start trigger enable signal, the end trigger enable signal and a time control signal; and a logic gate configured to generate the data enable signal based on the write-on signal and the write enable signal.

The time controller may include a first logic circuit configured to generate a write start signal indicating the start time point of the data capture duration; a second logic circuit configured to generate a write end signal indicating the end time point of the data capture duration; an internal timer configured to provide a relative time of the data capture; and a counter configured to count activation numbers of the start trigger enable signal and the end trigger enable signal.

The time controller may be configured to activate the write start signal and the write end signal in response to a start control signal and an end control signal, respectively, the start control signal and end control signal being signals provided from an external circuit outside of the time controller.

The time controller may be configured to activate the write start signal based on a system time from a system timer and a reference start time, and activate the write end signal based on the system time and a reference end time.

The time controller may be configured to count a first number of activations of the start trigger enable signal after a start control signal provided from an external circuit outside of the time controller is activated, activate the write start signal based on the first number of activations, count a second number of activations of the end trigger enable signal after an end control signal provided from the external circuit is activated, and activate the write end signal based on each of the second number of activations.

The time controller may be configured to count a first number of activations of the start trigger enable signal after a system time from a system timer coincides with a reference start time, activate each the write start signal based on the first number of activations, count a second number of activations of the end trigger enable signal after a system time from a system timer coincides with a reference end time, and activate the write end signal based on the second number of activations.

The first operation circuitry may be configured to vary the start trigger control signal based on a number of activations of the start trigger enable signal, and the second operation circuitry may be configured to vary the end trigger control signal based on a number of activations of the end trigger enable signal.

The packer circuitry may include data extractor circuitry configured to generate data bit signals based on the capture data signal, the data bit signals each having different numbers of bits; time information extractor circuitry configured to generate time information bit signals based on the time information signal, the time information bit signals each having different numbers of bits; synthesizer circuitry configured to combine the data bit signals and the time information bit signals to generate combined data signals that each have a same number of bits; and a multiplexer configured to selectively output one of the combined data signals as the packer data signal based on a time size signal.

The packer circuitry may include data extractor circuitry configured to generate a data bit signal of a fixed bit number based on the capture data signal; time information extractor circuitry configured to generate a time information bit signal of the fixed bit number based on the time information signal; and a multiplexer configured to selectively output one of the data bit signal and the time information bit signal as the packer data signal based on a time period signal.

The packer circuitry may be configured to adjust a number of bits that are captured for the capture data from among an entirety of bits of the capture data signal in response to a bit width signal.

The embedded logic analyzer may further include input selector circuitry configured to select, as the input data signal, one of logic signals from the function blocks.

The embedded logic analyzer may further include a buffer configured to store data of the packer data signal; and a direct memory access controller configured to transfer the data stored in the buffer to an embedded memory included in the integrated circuit or an external memory outside of the integrated circuit.

According to at least some example embodiments, an integrated circuit include the embedded logic analyzer; interconnect circuitry; and the function blocks, the function blocks being connected to the interconnect circuitry, the embedded logic analyzer being directly connected to at least one of the function blocks.

According to at least some example embodiments, an embedded logic analyzer included in an integrated circuit includes input selector circuitry configured to select as an input data signal one of logic signals from function blocks included in the integrated circuit and to provide the input data signal; a comparison block configured to generate a capture data signal and a plurality of comparison enable signals based on the input data signal such that the comparison enable signals are activated respectively based on different comparison conditions; an operation block configured to perform a logic operation on the comparison enable signals to generate a data enable signal indicating a data capture timing; packer circuitry configured to generate a packer data signal including capture data and capture time information based on the capture data signal, the data enable signal and a time information signal; and a main controller configured to control operations of the input selector circuitry, the comparison block, the operation block and the packer circuitry.

According to at least some example embodiments, an embedded logic analyzer includes first circuitry configured to, receive input data generated by at least one function block of an integrated circuit, and generate capture data based on reference data signals and the input data; and second circuitry configured to generate a packer data signal including debugging information of the integrated circuit by combining capture data and capture time information based on the capture data signal.

The embedded logic analyzer may further include an operation block, wherein the first circuitry is further configured to generate first enable signals, wherein the operation block is configured to perform a logic operation based on the first enable signals to generate a data enable signal indicating a data capture timing, and wherein the second circuitry is configured to generate the packer data signal based on the data enable signal, the capture data signal, and a time information signal.

The embedded logic analyzer and the integrated circuit including the embedded logic analyzer according to at least some example embodiments of the inventive concepts may efficiently control collection of data required for debugging and thus debugging of the integrated circuit may be performed efficiently by overcoming limits to internal resources of the integrated circuit such as traffic amount of a main bus, internal memory capacity, etc.

BRIEF DESCRIPTION OF THE DRAWINGS

The above and other features and advantages of example embodiments of the inventive concepts will become more apparent by describing in detail example embodiments of the inventive concepts with reference to the attached drawings. The accompanying drawings are intended to depict example embodiments of the inventive concepts and should not be interpreted to limit the intended scope of the claims. The accompanying drawings are not to be considered as drawn to scale unless explicitly noted.

FIG. 16 is a block diagram illustrating a packer included in the embedded logic analyzer of FIG. 2 according to at least some example embodiments of the inventive concepts.

FIGS. 17A, 17B and 17C are diagrams illustrating examples of packer data signals generated by the packer of FIG. 16.

DETAILED DESCRIPTION OF THE EMBODIMENTS

Figure 1:
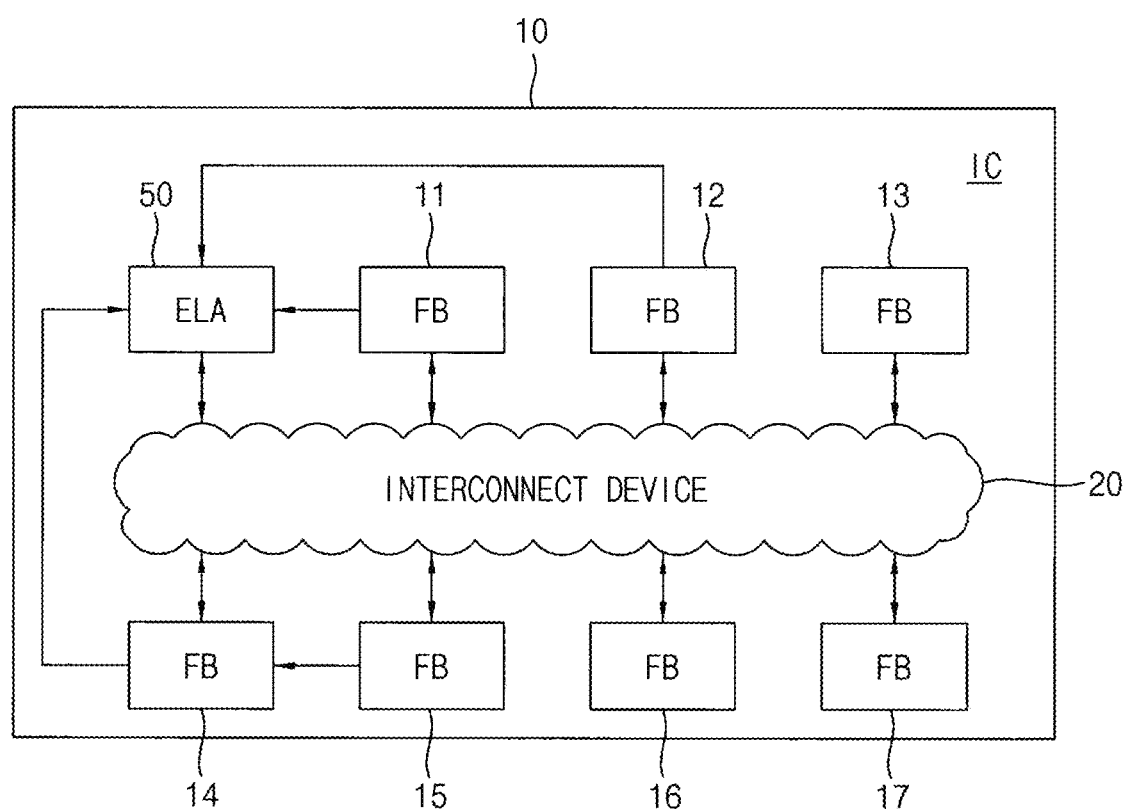
FIG. 1 is a block diagram illustrating an integrated circuit according to at least some example embodiments of the inventive concepts.

Detailed example embodiments of the inventive concepts are disclosed herein. However, specific structural and functional details disclosed herein are merely representative for purposes of describing example embodiments of the inventive concepts. Example embodiments of the inventive concepts may, however, be embodied in many alternate forms and should not be construed as limited to only the embodiments set forth herein.

Accordingly, while example embodiments of the inventive concepts are capable of various modifications and alternative forms, embodiments thereof are shown by way of example in the drawings and will herein be described in detail. It should be understood, however, that there is no intent to limit example embodiments of the inventive concepts to the particular forms disclosed, but to the contrary, example embodiments of the inventive concepts are to cover all modifications, equivalents, and alternatives falling within the scope of example embodiments of the inventive concepts. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the inventive concepts. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the inventive concepts. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Example embodiments of the inventive concepts are described herein with reference to schematic illustrations of idealized embodiments (and intermediate structures) of the inventive concepts. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating an integrated circuit according to at least some example embodiments of the inventive concepts.

Referring to FIG. 1, an integrated circuit IC 10 may include an interconnect device 20, a plurality of function blocks FB 11~17 connected to the interconnect device 20 and an embedded logic analyzer ELA 50 directly connected to at least one of the function blocks 11~17. Also the embedded logic analyzer 50 may be connected to the interconnect device 20. The embedded logic analyzer 50 may be integrated together with the function blocks 11~17 and the interconnect device 20 in the same semiconductor die. The number of the entire function blocks 11~17 and the number of the function blocks 11, 12 and 14 directly connected to the embedded logic analyzer 50 in FIG. 1 may be changed variously.

The interconnect device 20 may be embodied by circuitry. For example, the interconnect device 20 may be implemented with a various bus system including a main bus, a bridge, a peripheral bus, etc. The function blocks 11~17 may each be embodied by circuits or circuitry. For example, the function blocks 11~17 may include a memory controller, a display controller, a file system block, a graphic processing unit, an image signal processor, a multi-format codec block, a modem block, etc. A portion of the function blocks 11~17 may be slave devices such as a memory controller and another portion of the function blocks 11~17 may be master devices that issue requests for demanding services from the slave devices.

Hereinafter, configurations and operations of the embedded logic analyzer 50 according to at least some example embodiments of the inventive concepts are described with reference to FIGS. 2 through 22.

Figure 2:
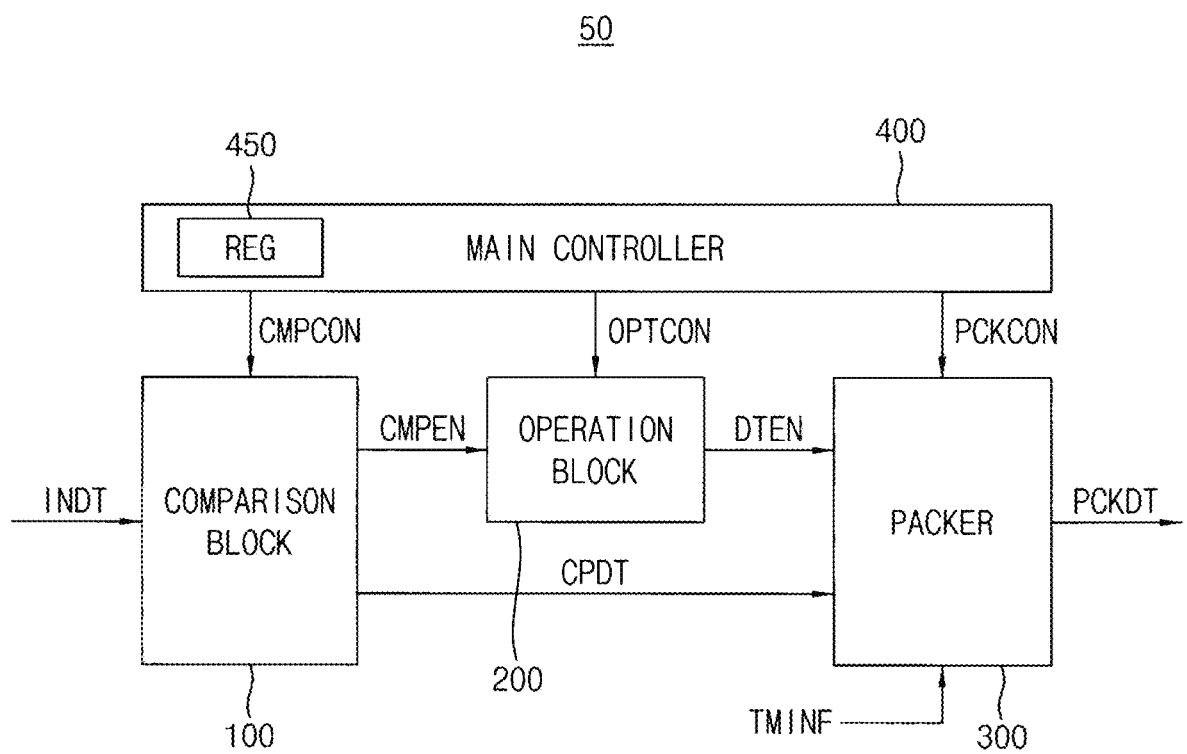
FIG. 2 is a block diagram illustrating an embedded logic analyzer according to at least some example embodiments of the inventive concepts.

FIG. 2 is a block diagram illustrating an embedded logic analyzer according to at least some example embodiments of the inventive concepts.

The embedded logic analyzer 50 may each be embodied by circuits or circuitry. For example, referring to FIG. 2, an embedded logic analyzer 50 may include a comparison block 100, an operation block 200, a packer 300 and a main controller 400, each of which may be embodied by circuits or circuitry.

The comparison block 100 may generate a capture data signal CPDT and a plurality of comparison enable signals CMPEN based on an input data signal INDT. The comparison enable signals CMPEN may be activated respectively in different comparison conditions. The input data signal INDT may be provided from at least one of the one function blocks directly connected to the embedded logic analyzer 50 as illustrated in FIG. 1. The input data signal INDT may be a parallel signal including multiple bits. The main controller 400 may generate comparison control signals CMPCON representing the comparison conditions to control the comparison block 100. The comparison control signals CMPCON may include shift control signals SFT, reference data signals CMPVL and selection signals CMPMX as will be described below with reference to FIGS. 3 through 6.

The operation block 200 may receive the comparison enable signals CMPEN and perform a logic operation on the comparison enable signals CMPEN to generate a data enable signal DTEN indicating the data capture timing. The main controller 400 may generate operation control signals OPTCON representing the logic operation to control the operation block 200. The operation control signals OPTCON may include a start trigger signal STROP, an end trigger control signal ETROP, a write enable control signal WENOP, a time control signal TMCON and a selection signal CNTOPT as will be described with reference to FIGS. 7 through 13.

The packer 300, which may also be referred to as packer circuitry 300, may receive the capture data signal CPDT from the comparison block 100 and the data enable signal DTEN from the operation block 200. The packer 300 may generate a packer data signal PCKDT including capture data and capture time information based on the capture data signal CPDT, the data enable signal DTEN and a time information signal TMINF. The main controller 400 may generate packer control signals PCKCON to control the operation of the packer 300. The packer control signals PCKCON may include a time size signal TMSZ, a time period signal TMPD and a bit width signal BTWD as will be described below with reference to FIGS. 14 through 19. The time information signal TMINF may represent an absolute time and/or a relative time of data capture. The time information signal TMINF may include a system time SYSTM provided from a system timer in the integrated circuit 10 and/or an internal time ELATM provided from an internal timer 253 as will be described with reference to FIG. 10. The information included in the packer data signal PCKDT may be used as debugging information for debugging operations of the integrated circuit 10. For example, according to at least one example embodiment, the packer data signal PCKDT may be provided to an external device or system outside the integrated circuit 10, and the external device or system may debugging operations with respect to the integrated circuit 10 (or one or more elements) based on the debugging information included in the packer data signal PCKDT.

The main controller 400 may include a register REG 450 storing control values and generate the signals CMPCON, OPTCON and PCKCON based on the stored values in the register 450. When a problem occurs in the integrated circuit 10, the control values may be set to be suitable for required debugging. Through setting of the control values, the start and end time points of the data capture duration, the data capture timing, selection of the capture data, combination of the capture time information, etc. may be controlled efficiently. For ease of description, FIG. 2 is described with reference to an example in which the main controller 400 is included in the embedded logic analyzer 50. However, at least some example embodiments of the inventive concepts are not limited to the example illustrated in FIG. 2, and the main controller 400 may be included in another function block such as a processor.

As such, the embedded logic analyzer 50 and the integrated circuit 10 including the embedded logic analyzer 50 according to at least some example embodiments of the inventive concepts may efficiently control collection of data required for debugging and thus debugging of the integrated circuit 10 may be performed efficiently by overcoming limits to internal resources of the integrated circuit 10 such as traffic amount of a main bus, internal memory capacity, etc.

Figure 3:
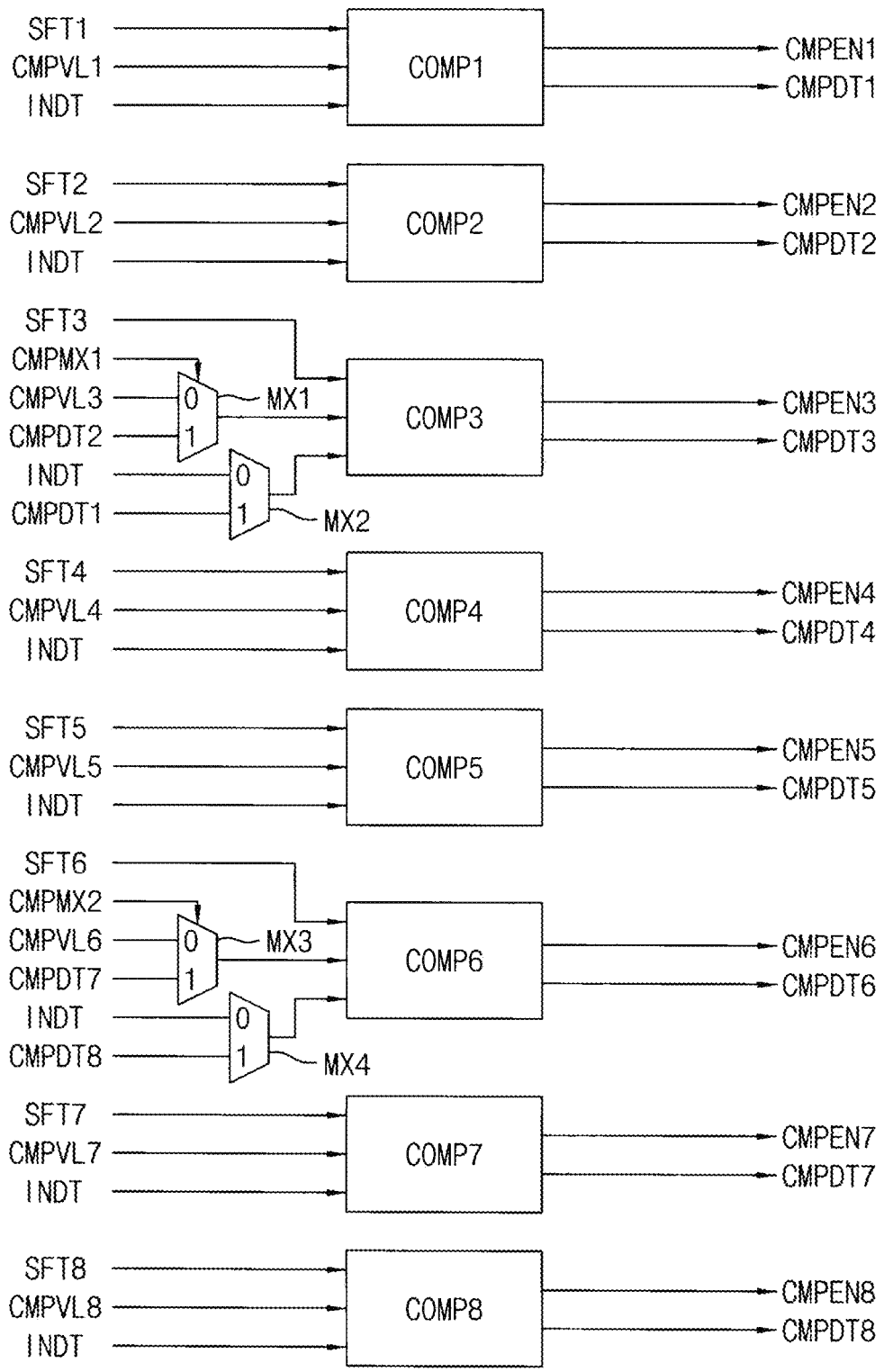
FIG. 3 is a block diagram illustrating a comparison block included in the embedded logic analyzer of FIG. 2 according to at least some example embodiments of the inventive concepts.

FIG. 3 is a block diagram illustrating a comparison block included in the embedded logic analyzer of FIG. 2 according to at least some example embodiments of the inventive concepts.

Referring to FIG. 3, a comparison block 100 may include a plurality of comparison units COMP1~COM8, each of which may be embodied by circuits or circuitry. Further, each of the comparison units COMP1~COMP8 may generate each of the comparison enable signals CMPEN1~CMPEN8 based on the input data signal INDT, each of shift control signals SFT1~SFT8, and reference data signals CMPVL1~CMPVL8 representing the above-mentioned comparison conditions. The shift control signals SFT1~SFT8 and the reference data signals CMPVL1~CMPVL8 may be included in the comparison control signals CMPCON provided by the main controller 400 as is shown in FIG. 2. FIG. 3 illustrates the eight comparison units COMP1~COMP8 for convenience of illustration and description, and the number of the comparison units may be changed variously.

One or more comparison units COMPi (i=1~8) of the comparison units COMP1~COMP8 (may shift the input data signal INDT to generate a shift data signal CMPDTi and compare the shift data signal CMPDTi with the reference data signal CMPVLi to generate the comparison enable signal CMPENi. For example, as illustrated in FIG. 3, the first comparison unit COMP1, the second comparison unit COMP2, the fourth comparison unit COMP4, the fifth comparison unit COMP5, the seventh comparison unit COMP7 and the eighth comparison unit COMP8 may correspond to the above-referenced one or more comparison units COMPi.

In contrast, one or more comparison units COMPk (k=1~8) of the comparison units COMP1~COMP8 may shift one of the input data signal INDT and a first shift data signal CMPDTm (mst sfrom another comparison unit CMPDTm to generate a second shift data signal CMPDTk and compare the second shift data signal CMPDTk with one of the reference data signal CMPVLk and a third shift data signal CMPDTn (nhift datafrom still another comparison unit COMPn to generate the comparison enable signal CMPENk. For example, as illustrated in FIG. 3, the third comparison unit COMP3 and the sixth comparison unit COMP6 may correspond to the above-referenced one or more comparison units COMPk. Multiplexers MX1, MX2, MX3 and MX4 may be disposed before the third comparison unit COMP3 and the sixth comparison unit COMP6 to output the data signal selectively in response to the selection signals CMPMX1 and CMPMX2, respectively.

As such, through the configuration such as illustrated in FIG. 3 and setting of the shift control signals SFT1~SFT8 and the reference data signals CMPVL1~CMPVL8, the comparison conditions for collecting data for required debugging may be set efficiently.

Figure 4:
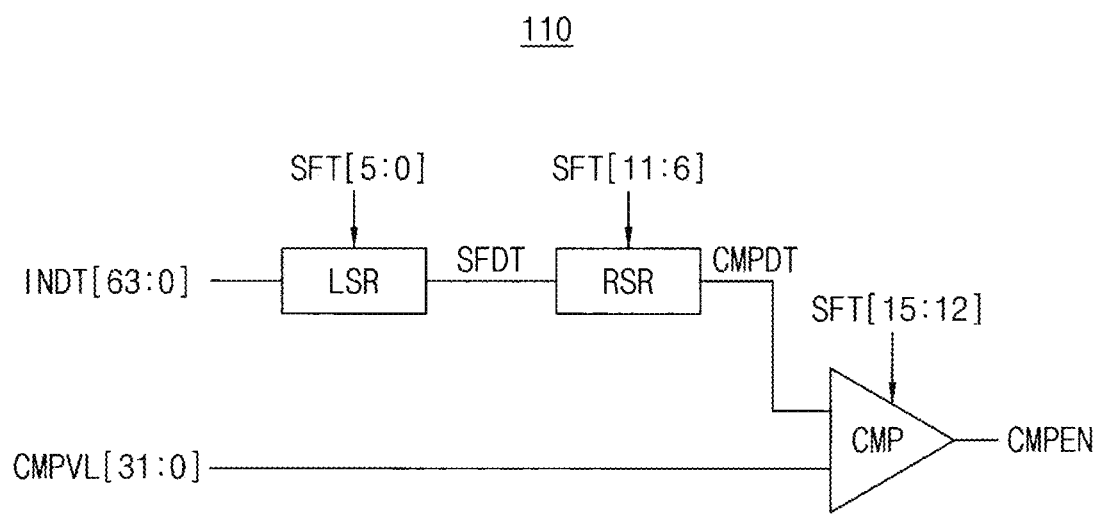
FIG. 4 is a diagram illustrating a comparison unit included in the comparison block of FIG. 3 according to at least some example embodiments of the inventive concepts.
Figure 5:
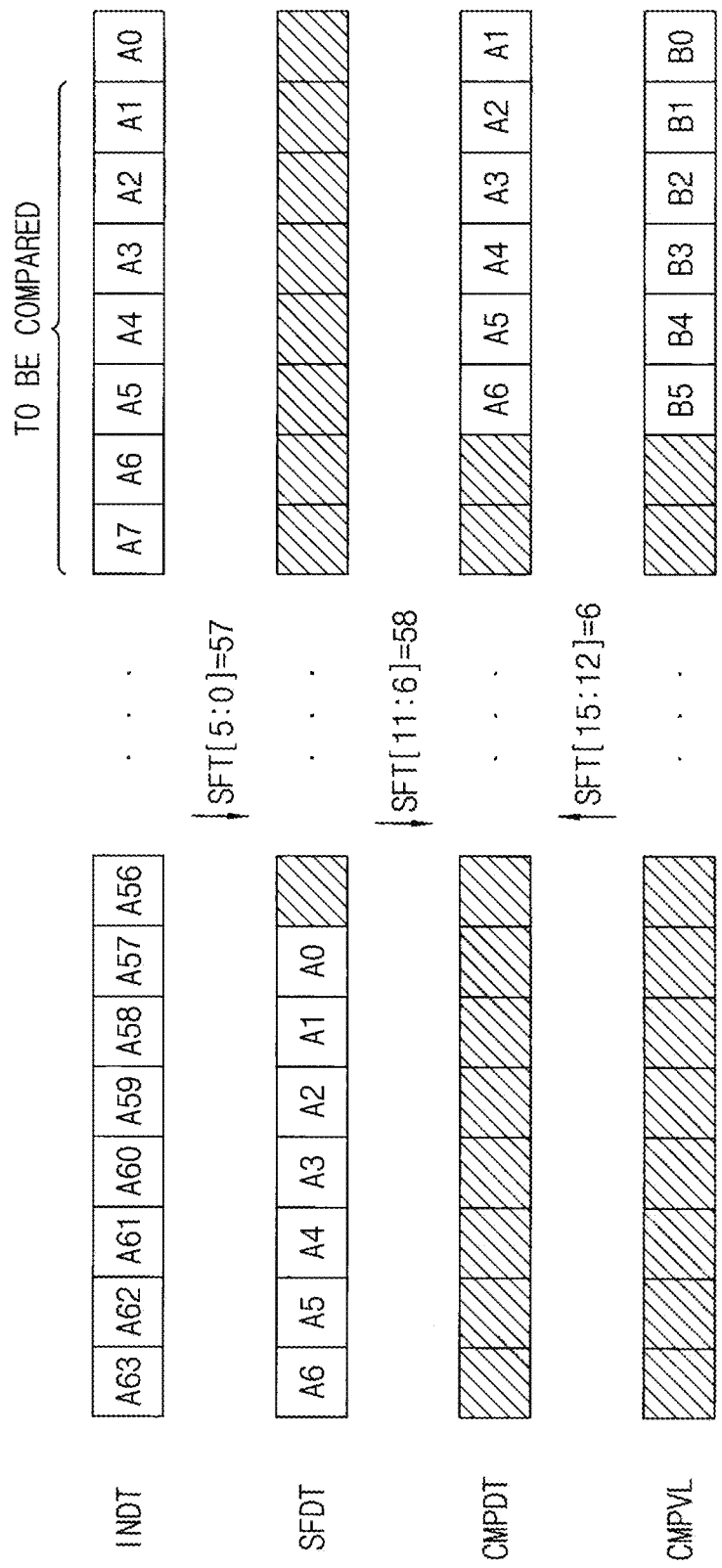
FIG. 5 is a diagram for describing an operation of the comparison unit of FIG. 4.

FIG. 4 is a diagram illustrating a comparison unit included in the comparison block of FIG. 3, and FIG. 5 is a diagram for describing an operation of the comparison unit of FIG. 4 according to at least some example embodiments of the inventive concepts.

Referring to FIG. 4, a comparison unit 110 may include a first shift register LSR, a second shift register RSR and a comparator CMP. For ease of description, FIG. 4 is described with reference to an example in which the input data signal INDT includes 64 bits INDT[63:0], the reference data signal CMPVL includes 32 bits CMPVL[31:0] and the shift control signal SFT includes 16 bits SFT[15:0]. However, at least some example embodiments of the inventive concepts are not limited to the example illustrated in FIG. 4, and the bit numbers of the signals may be changed variously in accordance with the requirements and/or desires of a user or manufacturer of the ELA 50.

The first shift register LSR may shift the input data signal INDT to the left in response to first bits SFT[5:0] of the shift control signal SFT where the first bits SFT[5:0] represent a left shift number. The second shift register RSR may shift an output signal SFDT of the first shift register LSR to the right in response to second bits SFT[11:6] of the shift control signal SFT where the second bits SFT[11:6] represent a right shift number. The comparator CMP may compare an output signal of the second shift register RSR, that is, the shift data signal CMPDT, with the reference data signal CMPVL[31:0] in response to third bits SFT[15:12] of the shift control signal SFT to generate the comparison enable signal CMPEN where the third bits SFT[15:12] represent a comparison bit number. The comparator CMP may activate the comparison enable signal CMPEN to a first logic level when the portion of the shift data signal CMPDT corresponding to the comparison bit number is equal to that of the reference data signal CMPVL and may deactivate the comparison enable signal CMPEN to a second logic level when the portion of the shift data signal CMPDT corresponding to the comparison bit number is not equal to that of the reference data signal CMPVL. The comparison enable signal CMPEN may be a pulse signal including pulses that are activated whenever the comparison condition is satisfied.

For example, as illustrated in FIG. 5, second through seventh data bits A1~A6 among first through sixty fourth data bits A0~A63 of the input data signal INDT may be the bits to be compared with the reference data signal CMPVL.

In this case, the first bits SFT[5:0] of the shift control signal SFT may be set to 57, the second bits SFT[11:6] of the shift control signal SFT may be set to 58, the first bits SFT[15:12] of the shift control signal SFT may be set to 6. Referring to the configuration of the FIG. 4, the input data signal INDT is shifted to the left by the left shift number of 57 and then shifted to the right by the right shift number of 58. Finally the less significant six bits A1~A6 of the shift data signal CMPDT may be compared with the less significant six bits B0-B5 of the reference data signal CMPVL.

Figure 6:
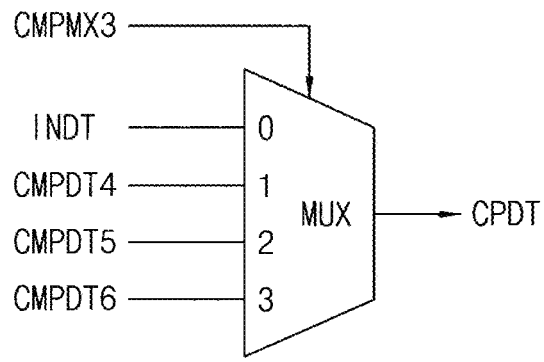
FIG. 6 is a diagram illustrating a data selector to output a capture data signal according to at least some example embodiments of the inventive concepts.

FIG. 6 is a diagram illustrating a data selector to output a capture data signal according to at least some example embodiments of the inventive concepts.

Referring to FIG. 6, a data extractor 150 may be implemented with a multiplexer MUX configured to select one of the input data signal INDT and the shift data signals CMPDT4, CMPDT5 and the CMPDT6 from the comparison units and to output the selected one as the capture data signal CPDT in response to, for example, selection signal CMPMX3. The data extractor 150 may also be referred to as a data selector 150 or data selector circuitry 150. In at least some example embodiments of the inventive concepts, the data selector 150 may be included in the comparison block 100 in FIG. 2.

The comparison data bits for determining whether the condition for the data capture is satisfied may be different from the captured data bits. Each of the comparison units COMP1~COMP8 in FIG. 3 may be used to determine whether the condition for the data capture is satisfied or used to shift and provide the data bits to be captured.

Figure 7:
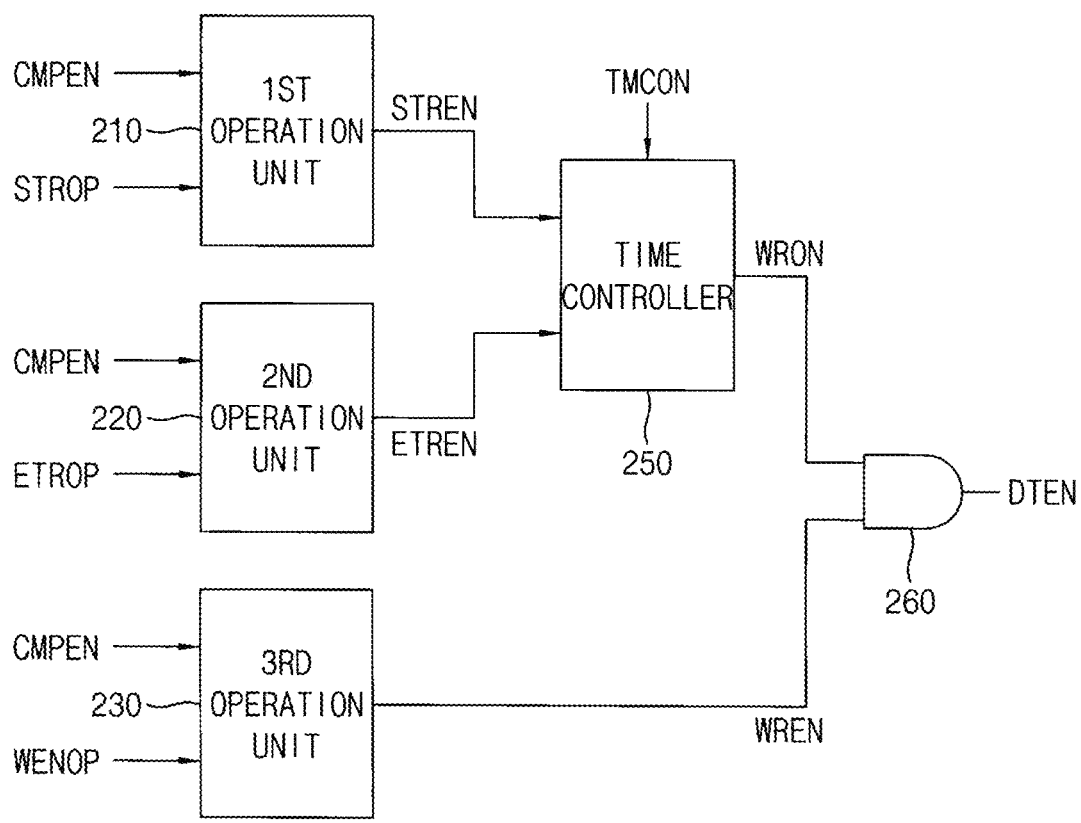
FIG. 7 is a block diagram illustrating an operation block included in the embedded logic analyzer of FIG. 2 according to at least some example embodiments of the inventive concepts.

FIG. 7 is a block diagram illustrating an operation block included in the embedded logic analyzer of FIG. 2 according to at least some example embodiments of the inventive concepts.

Referring to FIG. 7, an operation block 200 may include a first operation unit 210, a second operation unit 220, a third operation unit 230, a time controller 250 and a logic gate 260, each of which may be embodied by circuits or circuitry.

The first operation unit 210 may generate a start trigger enable signal STREN based on the comparison enable signals CMPEN and a start trigger control signal STROP. The second operation unit 220 may generate an end trigger enable signal ETREN based on the comparison enable signals CMPEN and an end trigger control signal ETROP. The third operation unit 230 may generate a write enable signal WREN based on the comparison enable signals CMPEN and a write enable control signal WENOP. The start trigger enable signal STREN may be used to determine a start time point of the data capture duration, the end trigger enable signal ETREN may be used to determine an end time point of the data capture duration and the write enable signal WREN may be used to determine the data capture timing. The first, second and third operation units 210, 220 and 230 may also be referred to as first, second and third operation circuitry 210, 220, and 230, respectively.

The time controller 250 may generate a write-on signal WRON indicating start and end time points of the data capture duration in response to the start trigger enable signal STREN, the end trigger enable signal ETREN and a time control signal TMCON. The logic gate 260 may generate the data enable signal DTEN indicating the data capture timing based on the write-on signal WRON and the write enable signal WREN. According to at last some example embodiments, the logic gate 260 may be, for example, an AND gate.

The start trigger control signal STROP, the end trigger control signal ETROP, the write enable control signal WENOP and the time control signal TMCON may be included in the operation control signals OPTCON provided by the main controller 400 as is illustrated in FIG. 2.

Figure 8:
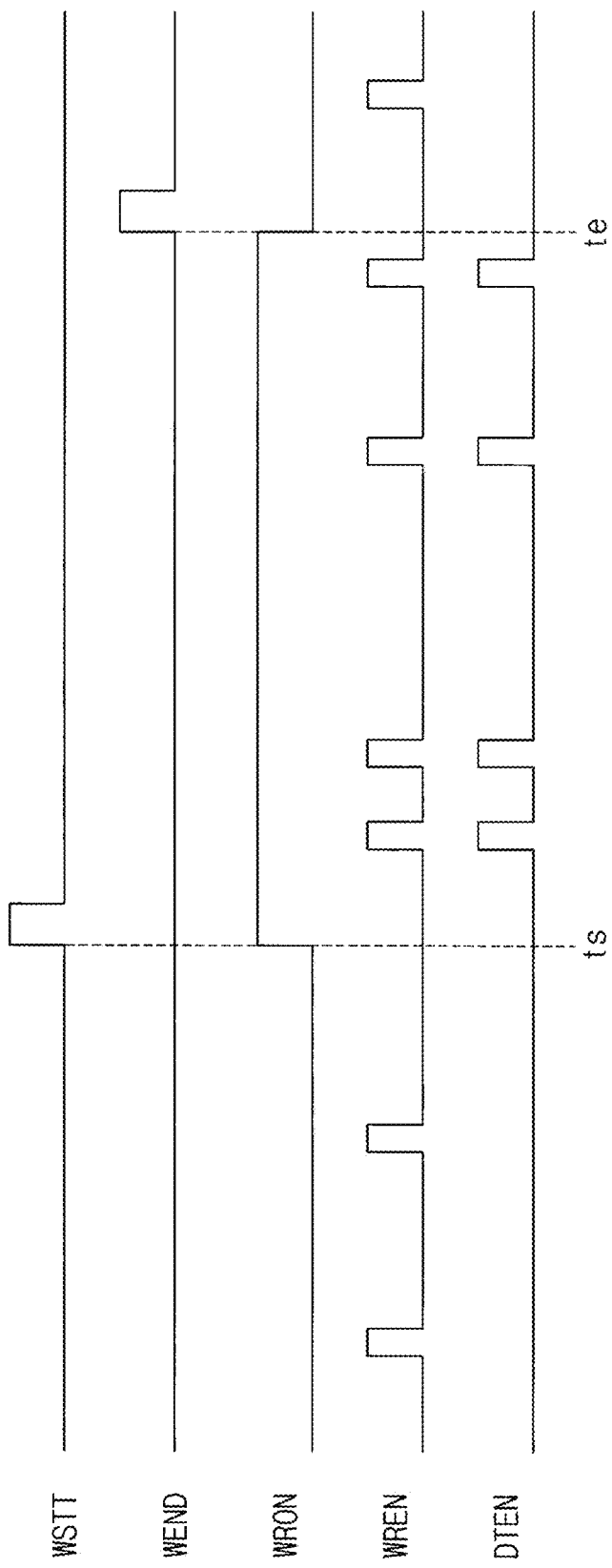
FIG. 8 is a timing diagram illustrating operations of a time controller and a logic gate included in the operation block of FIG. 7.

FIG. 8 is a timing diagram illustrating operations of a time controller and a logic gate included in the operation block of FIG. 7.

In FIG. 8, a write start signal WSTT indicates the start time point is of the data capture duration and a write end signal WEND indicates the end time point to of the data capture duration. The write start signal WSTT and the write end signal WEND may be generated inside the time controller 250, and the time controller may generate the write-on signal WRON based on the write start signal WSTT and the write end signal WEND. The data capture may be permitted when the write-on signal WRON is activated to a first logic level (e.g., a logic high level) and the data capture may be inhibited when the write-on signal WRON is deactivated to a second logic level (e.g., a logic low level). As illustrated in FIG. 8, even though the write enable signal WREN is enabled in a pulse shape, the data enable signal DTEN representing the data capture timing may maintain the deactivated state while the write-on signal WRON is deactivated. While the write-on signal WRON is activated between the data capture duration ts~te, the data enable signal DTEN may be activated in synchronization with the write enable signal WREN.

Figure 9:
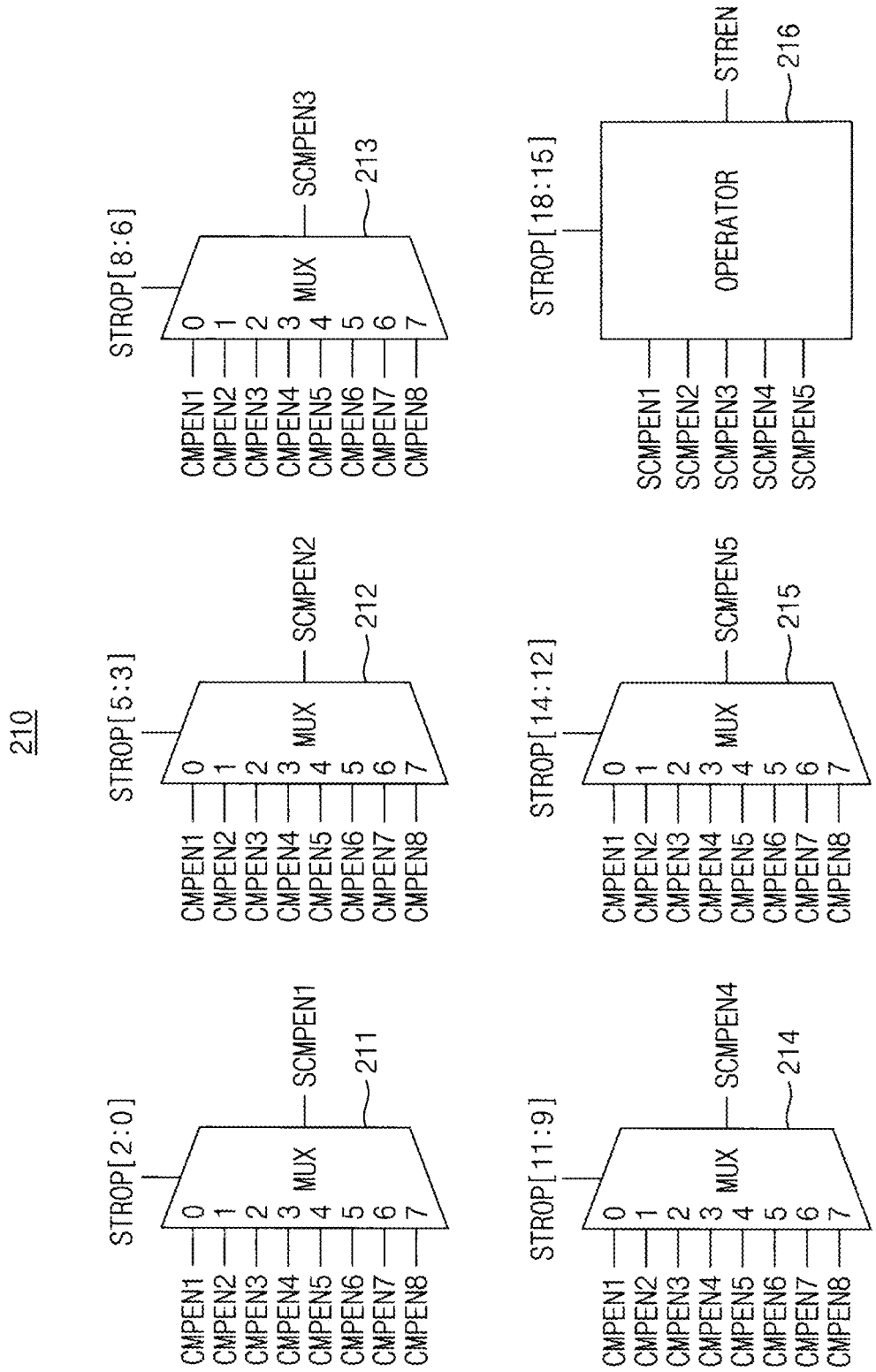
FIG. 9 is a diagram illustrating a first operation unit included in the operation block of FIG. 7 according to at least some example embodiments of the inventive concepts.

FIG. 9 is a diagram illustrating a first operation unit included in the operation block of FIG. 7 according to at least some example embodiments of the inventive concepts.

Referring to FIG. 9, the first operation unit 210 may include a plurality of multiplexers 211~215 and an operator 216 which may be embodied by a circuit or circuitry. The operator 216 may also be referred to as operator circuitry 216. The multiplexers 211~215 may output selected comparison enable signals SCMPEN1~SCMPEN5 corresponding to a portion of the comparison enable signals CMPEN1~CMPEN8 in response to the start trigger control signal STROP. For example, as illustrated in FIG. 9, the first multiplexer 211 may select one of the comparison signal CMPEN1~CMPEN8 in response to first bits STROP[2:0] of the start trigger control signal STROP to output the first selected comparison enable signal SCMPEN1, the second multiplexer 212 may select one of the comparison signal CMPEN1~CMPEN8 in response to second bits STROP[5:3] of the start trigger control signal STROP to output the second selected comparison enable signal SCMPEN2, the third multiplexer 213 may select one of the comparison signal CMPEN1~CMPEN8 in response to third bits STROP[8:6] of the start trigger control signal STROP to output the third selected comparison enable signal SCMPEN3, the fourth multiplexer 214 may select one of the comparison signal CMPEN1~CMPEN8 in response to fourth bits STROP[11:9] of the start trigger control signal STROP to output the fourth selected comparison enable signal SCMPEN4, and the fifth multiplexer 215 may select one of the comparison signal CMPEN1~CMPEN8 in response to fifth bits STROP[14:12] of the start trigger control signal STROP to output the fifth selected comparison enable signal SCMPEN5. The number of the comparison enable signals, the number of the multiplexers and the bit number of the start trigger control signal STROP may be changed variously.

The operator 216 may perform a logic operation on the selected comparison enable signals SCMPEN1~SCMPEN5 in response to the start trigger control signal STROP to generate the start trigger enable signal STREN. The operator 216 may perform different logic operations on the selected comparison enable signals SCMPEN1~SCMPEN5 to provide various results of the logic operations. The operator 216 may select one of the results of the logic operations in response to sixth bits STROP[18:15] of the start trigger enable signal STREN as illustrated in FIG. 9 to output the selected one as the start trigger enable signal STREN. The logic operations may be implemented as various combinations of an AND logic operation, an OR logic operation, a NOT logic operation, etc.

FIG. 9 illustrates an example embodiment of the first operation unit 210. Further, the second operation unit 220 and the third operation unit 230 in FIG. 7 may have configurations that are the same as or, alternatively, similar to the configuration of FIG. 9. For example, the second operation unit 220 may include a plurality of multiplexers configured to output selected comparison enable signals corresponding to a portion of the comparison enable signals CMPEN1~CMPEN8 in response to the end trigger control signal ETROP and an operator configured to perform a logic operation on the selected comparison enable signals in response to the end trigger control signal ETROP to generate the end trigger enable signal ETREN. The third operation unit 230 may include a plurality of multiplexers configured to output selected comparison enable signals corresponding to a portion of the comparison enable signals CMPEN1~CMPEN8 in response to the write enable control signal WENOP and an operator configured to perform a logic operation on the selected comparison enable signals in response to the write enable control signal WENOP to generate the write enable signal WREN.

Figure 10:
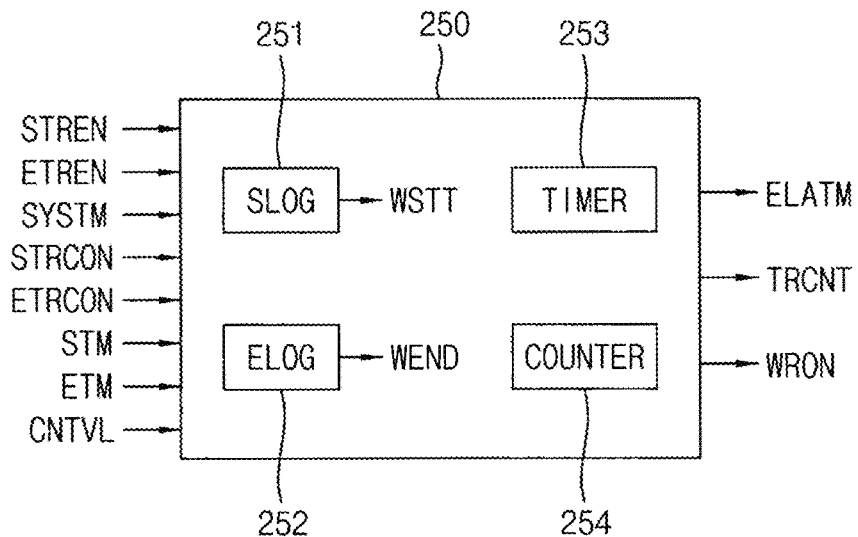
FIG. 10 is a diagram illustrating a time controller included in the operation block of FIG. 7 according to at least some example embodiments of the inventive concepts.

FIG. 10 is a diagram illustrating a time controller included in the operation block of FIG. 7 according to at least some example embodiments of the inventive concepts.

Referring to FIG. 10, a time controller 250 may include a first logic circuit SLOG 251, a second logic circuit ELOG 252, an internal timer 253 and a counter 254.

The first logic circuit 251 may generate a write start signal WSTT indicating the start time point of the data capture duration. The second logic circuit 252 may generate a write end signal WEND indicating the end time point of the data capture duration. The internal timer 253 may provide a relative time of the data capture. The counter 254 may count activation numbers of the start trigger enable signal STREN and the end trigger enable signal ETREN.

The time controller 250 may receive the start trigger enable signal STREN and the end trigger enable signal ETREN from the first and second operation units 210 and 220 in FIG. 7, a system time SYSTM from a system timer in the integrated circuit 10, a start control signal STRCON, an end control signal ETRCON, a reference start time STM, a reference end time ETM and a reference count signal CNTVL and generate an internal time ELATM, a trigger count signal TRCNT and a write-on signal WRON. The start control signal STRCON, the end control signal ETRCON, the reference start time STM, the reference end time ETM and the reference count signal CNTVL may be included in the time control signal TMCON in FIG. 7 and may be provided from the main controller 400 in FIG. 2.

FIGS. 11A through 11F are diagrams illustrating example operations of the time controller of FIG. 10. The signal illustrated in FIGS. 11A through 11F may be one of two signals. For example, FIG. 11A may represent a timing relation between the start control signal STRCON and the write start signal WSTT or a timing relation between the end control signal ETRCON and the write end signal WEND.

Figure 11A:
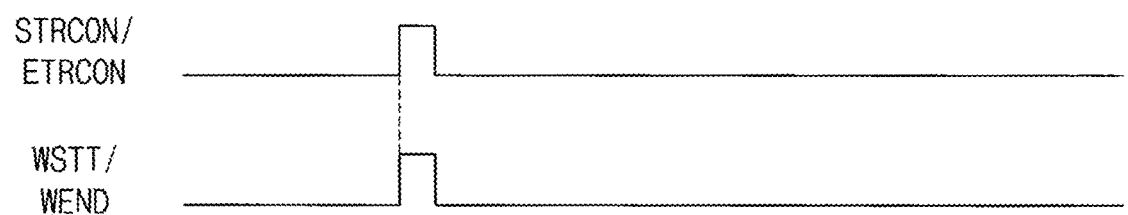
FIGS. 11A through 11F are diagrams illustrating example operations of the time controller of FIG. 10.

Referring to FIG. 11A, the time controller 250 may activate each of the write start signal WSTT and the write end signal WEND in response to each of the start control signal STRCON and an end control signal ETRCON, respectively. According to at least some example embodiments of the inventive concepts, the start control signal STRCON and an end control signal ETRCON may be provided from an external circuit outside of the time controller 250, for example, from the main controller 400 in FIG. 2.

Figure 11B:
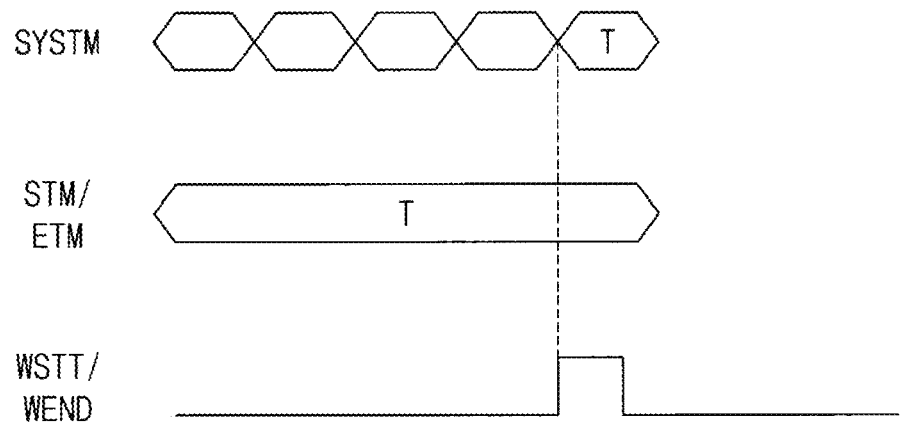

Referring to FIG. 11B, the time controller 250 may activate each of the write start signal WSTT and the write end signal WEND when a system time SYSTM from a system timer coincides with each of the reference start time STM and the reference end time ETM, respectively.

Figure 11C:
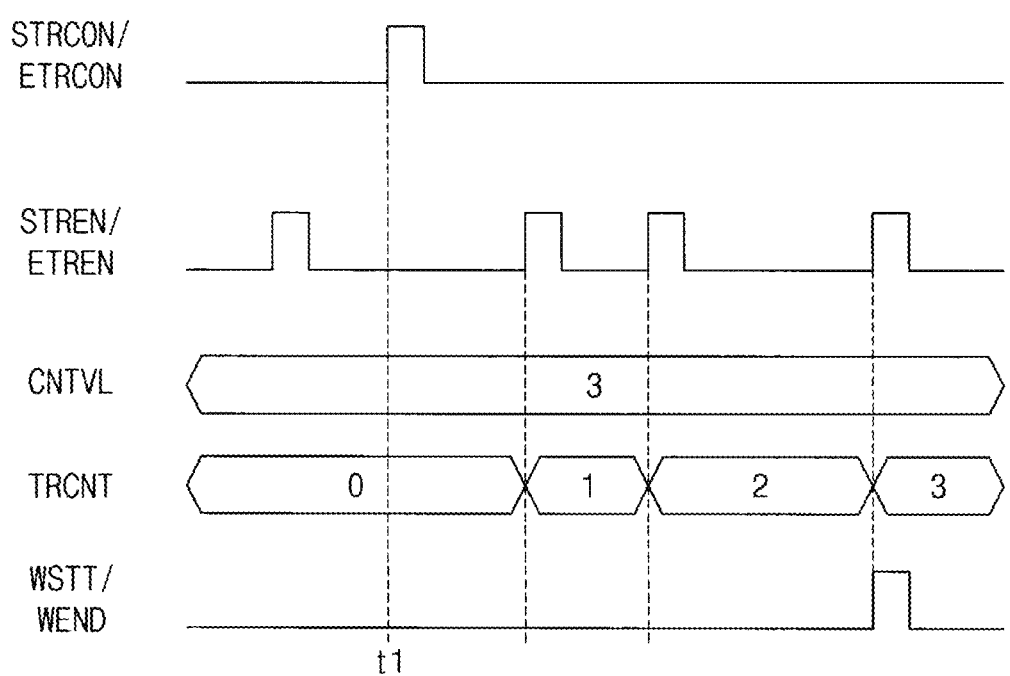

Referring to FIG. 11C, the time controller 250 may count each of the activation numbers (e.g., count a number of activations) of the start trigger enable signal STREN and the end trigger enable signal ETREN after each of the start control signal STRCON and the end control signal ETRCON is activated, and activate each of the write start signal WSTT and the write end signal WEND based on each of the activation numbers. For example, the reference count signal CNTVL is set to a value of "3" and the each of the write start signal WSTT and the write end signal WEND may be activated when the trigger count signal TRCNT has the value of "3."

Figure 11D:
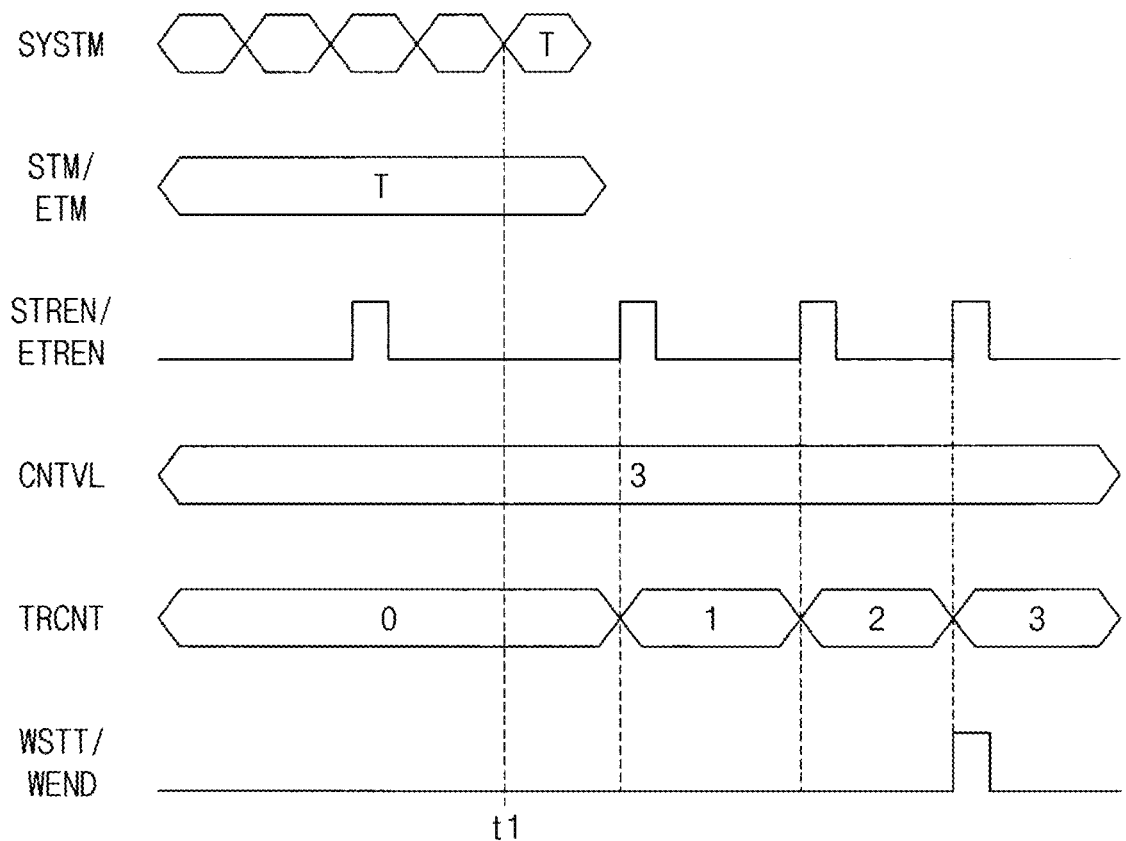

Referring to FIG. 11D, the time controller 250 may count each of the activation numbers (e.g., count a number of activations) of the start trigger enable signal STREN and the end trigger enable signal ETREN after the system time SYSTM coincides with each of the reference start time STM and the reference end time ETM, and activate each of the write start signal WSTT and the write end signal WEND based on each of the activation numbers. For example, the reference count signal CNTVL is set to a value of "3" and the each of the write start signal WSTT and the write end signal WEND may be activated when the trigger count signal TRCNT has the value of "3."

Figure 11E:
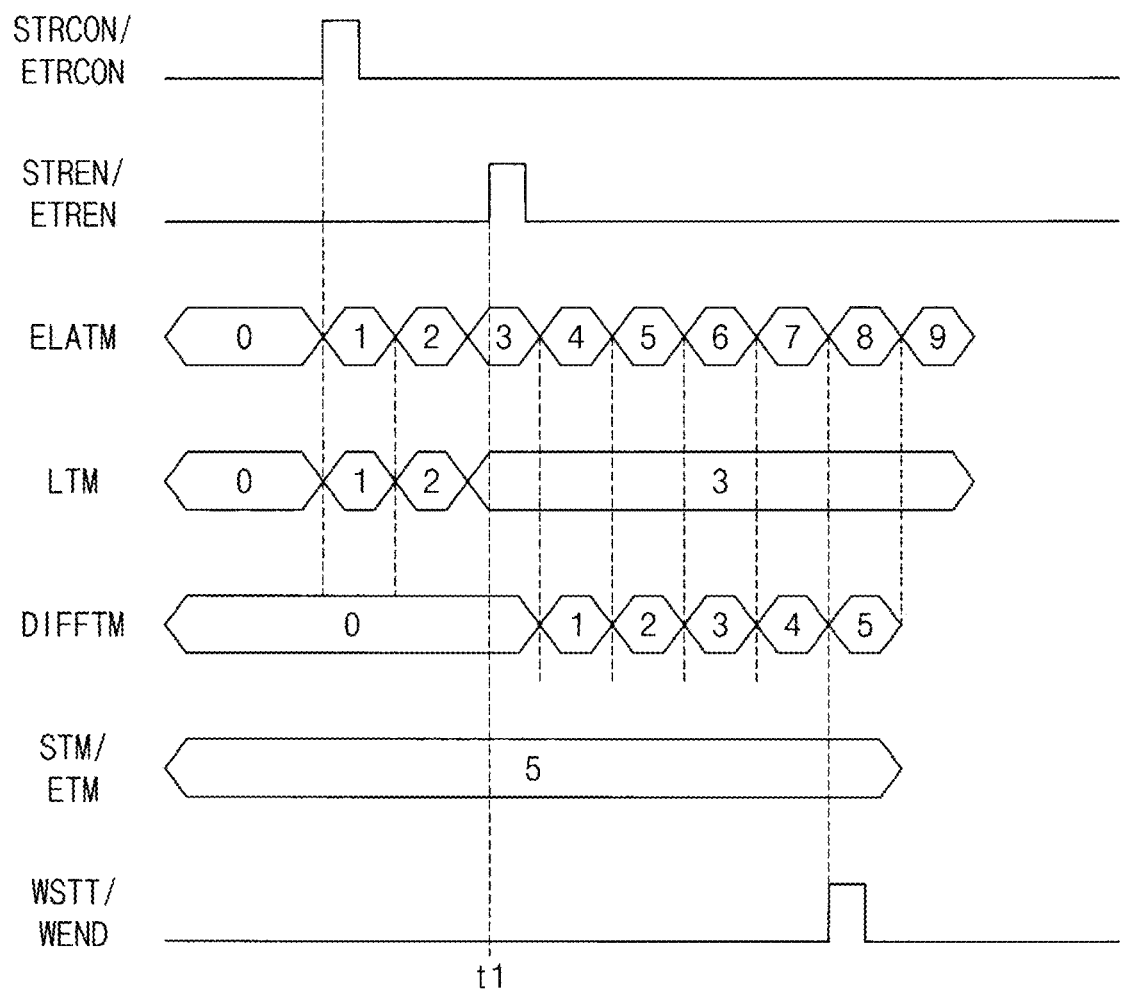

Referring to FIG. 11E, the time controller 250 may latch the internal time ELATM at a time point t1 after the start control signal STRCON is activated when the start trigger enable signal STREN is activated. Additionally, the time controller 250 may latch the internal time ELATM at a time point (also illustrated as t1) after the end control signal ETRCON is activated when the end trigger enable signal ETREN is activated. The time controller 250 may activate each of the write start signal WSTT and the write end signal WEND based on a difference DIFFTM between the latched time LTM and the internal time ELATM. For example, each of the reference start time STM and the reference end time ETM is set to a value of "5" and the each of the write start signal WSTT and the write end signal WEND may be activated when the time difference DIFFTM becomes the value of "5".

Figure 11F:
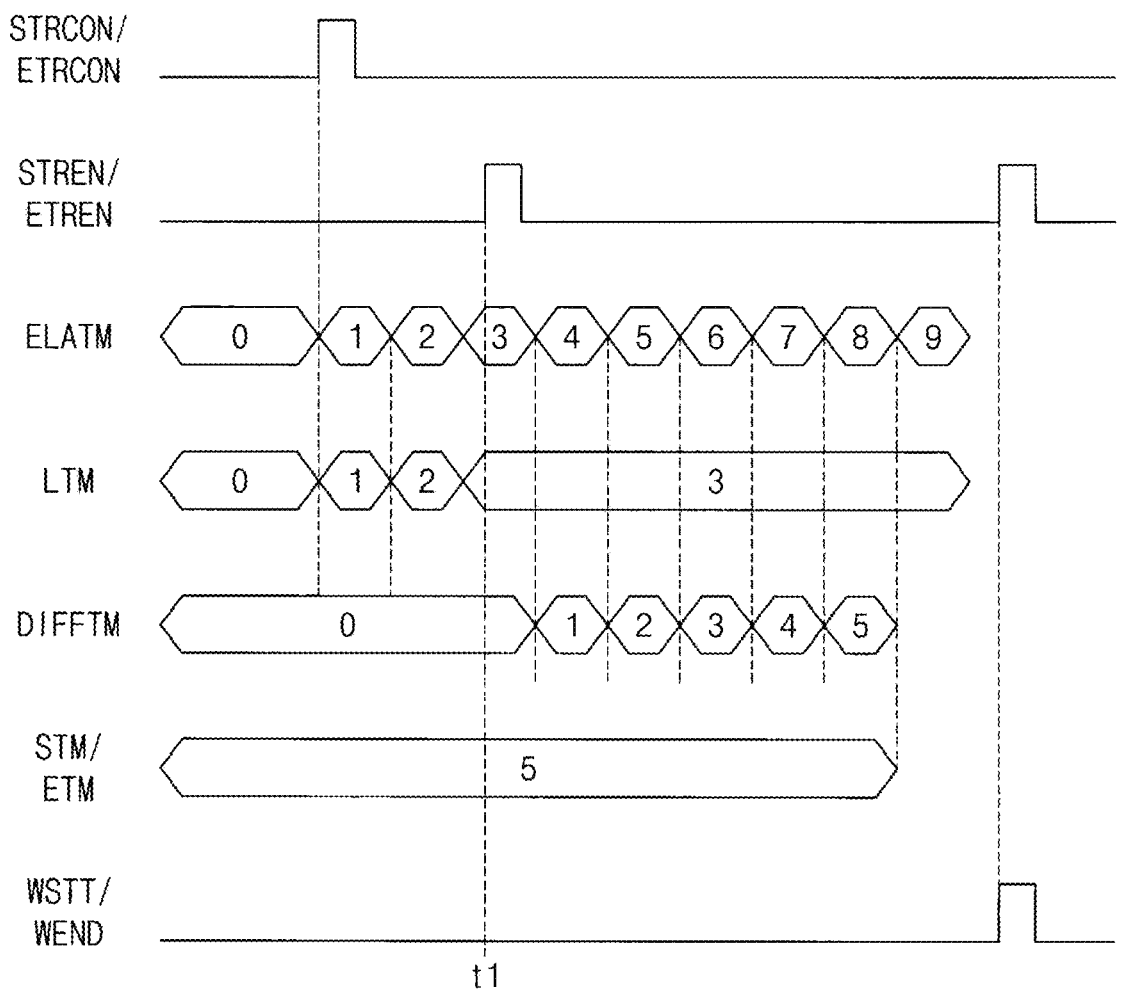

Referring to FIG. 11F, the time controller 250 may latch the internal time ELATM at a time point t1 after the start control signal STRCON is activated when the start trigger enable signal STREN is activated. Additionally, the time controller 250 may latch the internal time ELATM at a time point (also illustrated as t1) after the end control signal ETRCON is activated when the end trigger enable signal ETREN is activated. The time controller 250 may activate each of the write start signal WSTT and the write end signal WEND based on a difference DIFFTM between the latched time LTM and the internal time ELATM. For example, each of the reference start time STM and the reference end time ETM is set to a value of "5" and the each of the write start signal WSTT and the write end signal WEND may be activated when each of the start trigger enable signal STREN and the end trigger enable signal ETREN is activated after the time difference DIFFTM becomes the value of "5".

Figure 12:
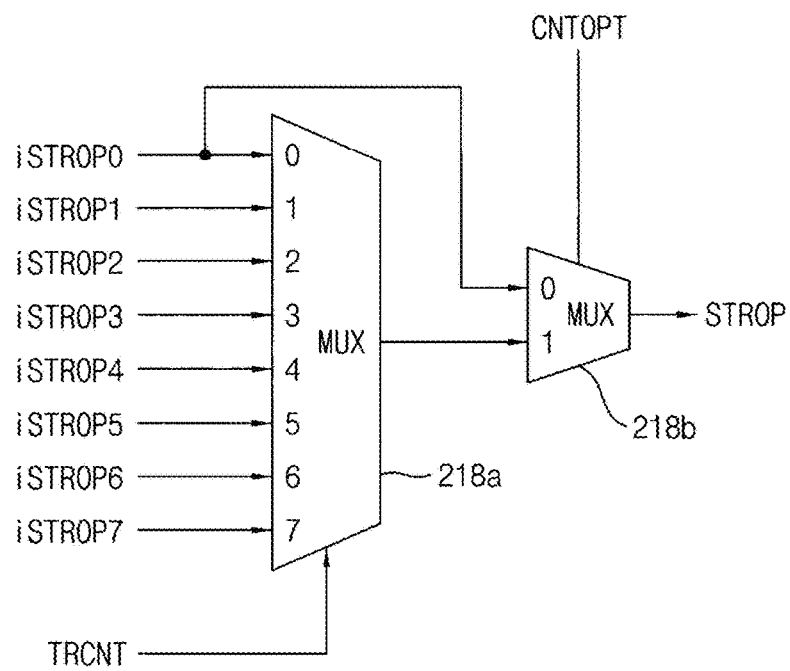
FIG. 12 is a diagram illustrating a control signal selector to vary a trigger control signal according to at least some example embodiments of the inventive concepts.
Figure 13:
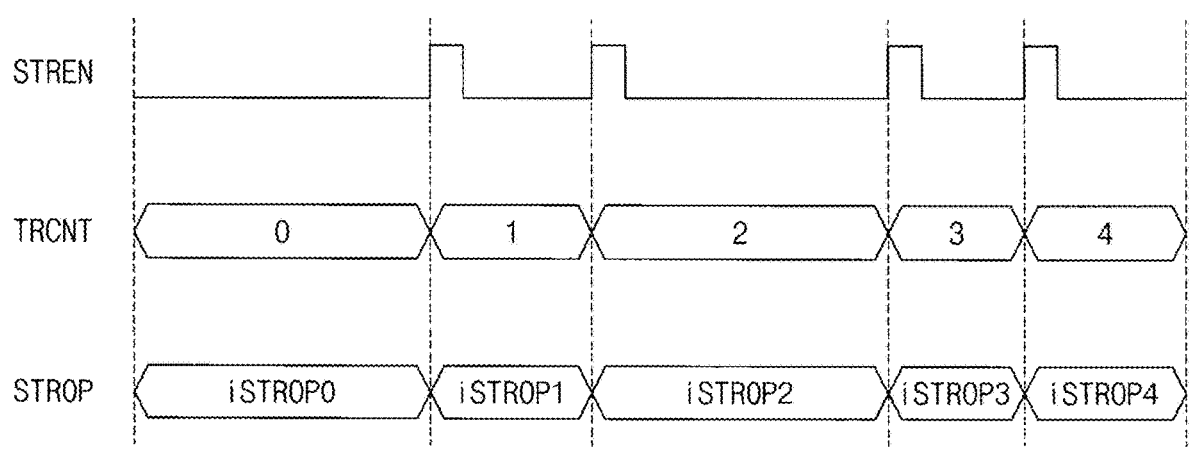
FIG. 13 is a diagram illustrating an operation of the control signal selector of FIG. 12.

FIG. 12 is a diagram illustrating a control signal selector to vary a trigger control signal according to at least some example embodiments of the inventive concepts, and FIG. 13 is a diagram illustrating an operation of the control signal selector of FIG. 12 according to at least some example embodiments of the inventive concepts.

Referring to FIGS. 12 and 13, a control signal selector 218 may include a first multiplexer 218a and a second multiplexer 218b. The first multiplexer 218a may select and output one of input start trigger control signals iSTROP0~iSTROP7 in response to a trigger count signal TRCNT. The second multiplexer 218b may select and output one of the fixed one input start trigger control signal iSTROP0 and the output of the first multiplexer 218a in response to a selection signal CNTOPT. As illustrated in FIG. 13, the value of the trigger count signal TRCNT may be increased sequentially whenever the start trigger enable signal STREN is activated, and thus the value of the start trigger control signal STROP may be changed sequentially.

FIGS. 12 and 13 illustrate variation of the start trigger control signal STROP, and the end trigger control signal ETROP may be varied in the similar method. As such, each of the first operation unit 210 and the second operation unit 220 in FIG. 7 may vary each of the start trigger control signal STROP and the end trigger control signal ETROP based on each of activation numbers of the start trigger enable signal STREN and the end trigger enable signal ETREN.

Figure 14:
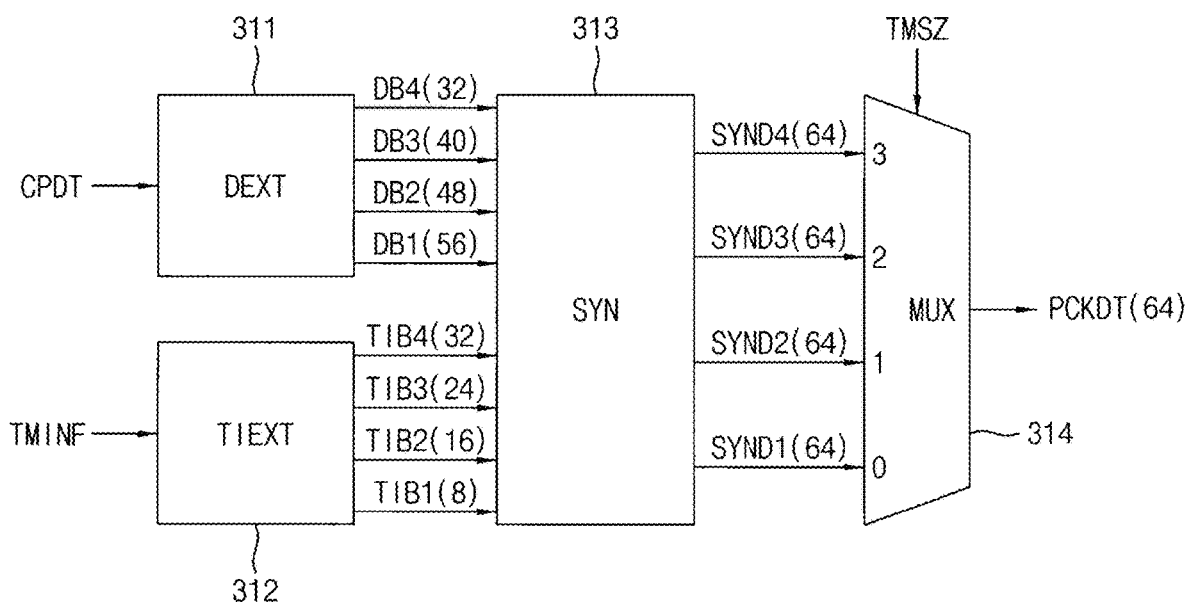
FIG. 14 is a block diagram illustrating a packer included in the embedded logic analyzer of FIG. 2 according to at least some example embodiments of the inventive concepts.
Figure 15:
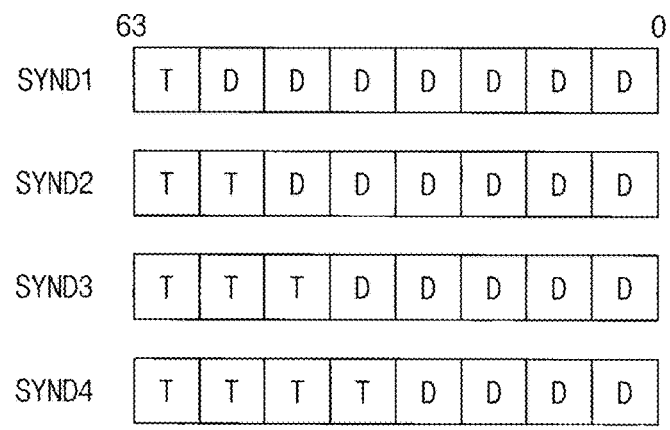
FIG. 15 is a diagram illustrating combined data signals generated by the packer of FIG. 14.

FIG. 14 is a block diagram illustrating of a packer included in the embedded logic analyzer of FIG. 2 according to at least some example embodiments of the inventive concepts, and FIG. 15 is a diagram illustrating combined data signals generated by the packer of FIG. 14 according to at least some example embodiments of the inventive concepts.

Referring to FIG. 14, a packer 301, which may also be referred to as packer circuitry 301, may include a data extractor DEXT 311, a time information extractor TIEXT 312, a synthesizer SYN 313 and a multiplexer MUX 314. The data extractor DEXT 311, time information extractor TIEXT 312, and synthesizer SYN 313 may each be embodied by circuits or circuitry. The data extractor DEXT 311, time information extractor TIEXT 312, and synthesizer SYN 313 may also be referred to as data extractor circuitry, time information circuitry, and synthesizer circuitry. Even though not illustrated in FIG. 14, the packer 301 may receive the data enable signal DTEN representing the data capture timing as described above. The packer 301 may generate the packer data signal PCKDT in synchronization with the data enable signal DTEN.

The data extractor 311 may generate data bit signals DB1~DB4 of different bit numbers (e.g., 32 bits, 40 bits, 48 bits, 56 bits, etc.) based on the capture data signal CPDT. The time information extractor 312 may generate time information bit signals TIB1~TIB4 of different bit numbers (e.g., 32 bits, 24 bits, 16 bits, 8 bits, etc.) based on the time information signal TMINF. The example bit numbers of the signals are illustrated in the parentheses. The synthesizer 313 may combine the data bit signals DB1~DB4 and the time information bit signals TIB1~TIB4 to generate combined data signals SYND1~SYND4 of the same entire bit number (e.g., combined data signals including 32+32=40+ 24=48+16=56+8=64 bits) such that the combined data signals SYND1~SYND4 include the capture time information of different bit numbers.

FIG. 15 illustrates an example of the combined data signals SYND1~SYND4. In FIG. 15, "D" represents the captured data and "T" represents the time information of the captured data. The first combined data signal SYND1 includes the time information of 8 bits and the captured data of 56 bits, the second combined data signal SYND2 includes the time information of 16 bits and the captured data of 48 bits, the third combined data signal SYND3 includes the time information of 24 bits and the captured data of 40 bits, and the fourth combined data signal SYND4 includes the time information of 32 bits and the captured data of 32 bits.

The multiplexer 314 may select one of the combined data signals SYND1~SYND4 based on a time size signal TMSZ from the main controller 400 in FIG. 2 to output the selected one as the packer data signal PCKDT.

As such, the bit number of the time information included in the packer data signal PCKDT may be controlled efficiently by changing the value of the time size signal TMSZ.

Figures 16, 17A:
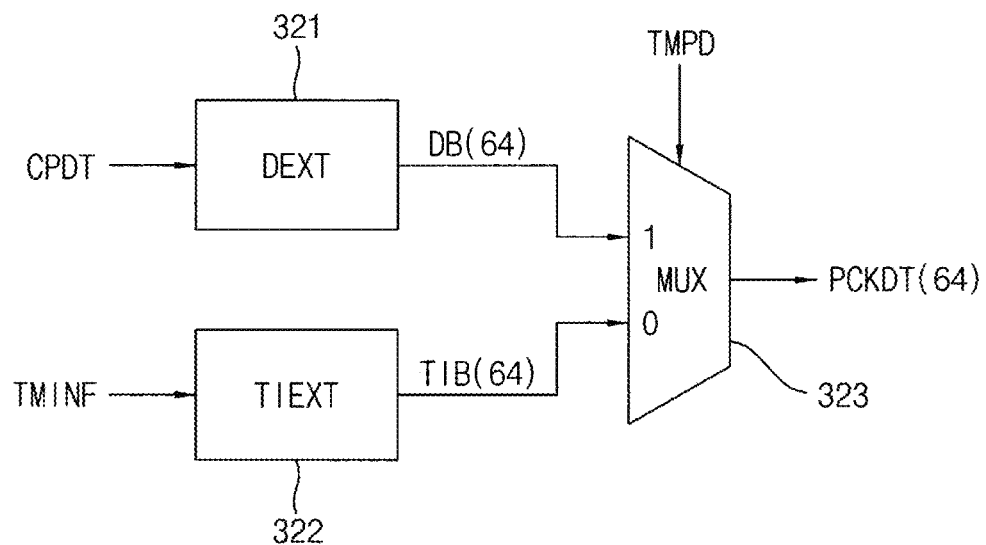

FIG. 16 is a block diagram illustrating a packer included in the embedded logic analyzer of FIG. 2 according to at least some example embodiments of the inventive concepts.

Referring to FIG. 16, a packer 302, which may also be referred to a packer circuitry 302, may include a data extractor DEXT 321, a time information extractor TIEXT 322 and a multiplexer MUX 323. The data extractor DEXT 321 and time information extractor TIEXT 322 may each be embodied by circuits or circuitry. Even though not illustrated in FIG. 16, the packer 302 may receive the data enable signal DTEN representing the data capture timing as described above. The packer 302 may generate the packer data signal PCKDT in synchronization with the data enable signal DTEN.

The data extractor 321 may generate a data bit signal DB of a fixed bit number (e.g., a fixed number of bits) based on the capture data signal CPDT. The time information extractor 322 may generate a time information bit signal TIB of the fixed bit number based on the time information signal TMINF. The example bit numbers of the signals are illustrated in the parentheses (e.g., 64 bits). The bit number of the data bit signal DB may be equal to the bit number of the time information bit signal TIB.

The multiplexer 323 may select one of the data bit signal DB and the time information bit signal TIB based on a time period signal TMPD from the main controller 400 in FIG. 2 to output the selected one as the packer data signal PCKDT.

FIGS. 17A, 17B and 17C are diagrams illustrating examples of packer data signals generated by the packer of FIG. 16.

Referring to FIG. 17A, the capture data D0 of 64 bits may be output as the packer data signal PCKDT at time t1, the capture data D1 of 64 bits may be output as the packer data signal PCKDT at time t2 and then the time information T0 and T1 may be output as the packer data signal PCKDT at time t3. In the same way, the capture data D2 and D3 may be output as the packer data signal at times t4 and t5 and then the time information T2 and T3 may be output as the packer data signal PCKDT at time t6. As a result, the time information of 32 bits may be assigned to the capture data of 64 bits.

Referring to FIG. 17B, the capture data D0 of 64 bits may be output as the packer data signal PCKDT at time t1, the capture data D1 of 64 bits may be output as the packer data signal PCKDT at time t2, the capture data D2 of 64 bits may be output as the packer data signal PCKDT at time t3, the capture data D3 of 64 bits may be output as the packer data signal PCKDT at time t4, and then the time information T0, T1, T2 and T3 may be output as the packer data signal PCKDT at time t5. In the same way, the capture data D4, D5, D6 and D7 may be output as the packer data signal at times t6, t7, t8 and t9 and then the time information T4, T5, T6 and T7 may be output as the packer data signal PCKDT at time t10. As a result, the time information of 16 bits may be assigned to the capture data of 64 bits.

Referring to FIG. 17C, the capture data D0 of 64 bits may be output as the packer data signal PCKDT at time t1, the capture data D1 of 64 bits may be output as the packer data signal PCKDT at time t2, the capture data D2 of 64 bits may be output as the packer data signal PCKDT at time t3, the capture data D3 of 64 bits may be output as the packer data signal PCKDT at time t4, the capture data D4 of 64 bits may be output as the packer data signal PCKDT at time t5, the capture data D5 of 64 bits may be output as the packer data signal PCKDT at time t6, the capture data D6 of 64 bits may be output as the packer data signal PCKDT at time t7, the capture data D7 of 64 bits may be output as the packer data signal PCKDT at time t8, and then the time information T0, T1, T2, T3, T4, T5, T6 and T7 may be output as the packer data signal PCKDT at time t9. As a result, the time information of 8 bits may be assigned to the capture data of 64 bits.

As such, the bit number of the time information included in the packer data signal PCKDT may be controlled efficiently as illustrated in FIGS. 17A, 17B and 17C by changing the value of the time period signal TMPD.

Figure 18:
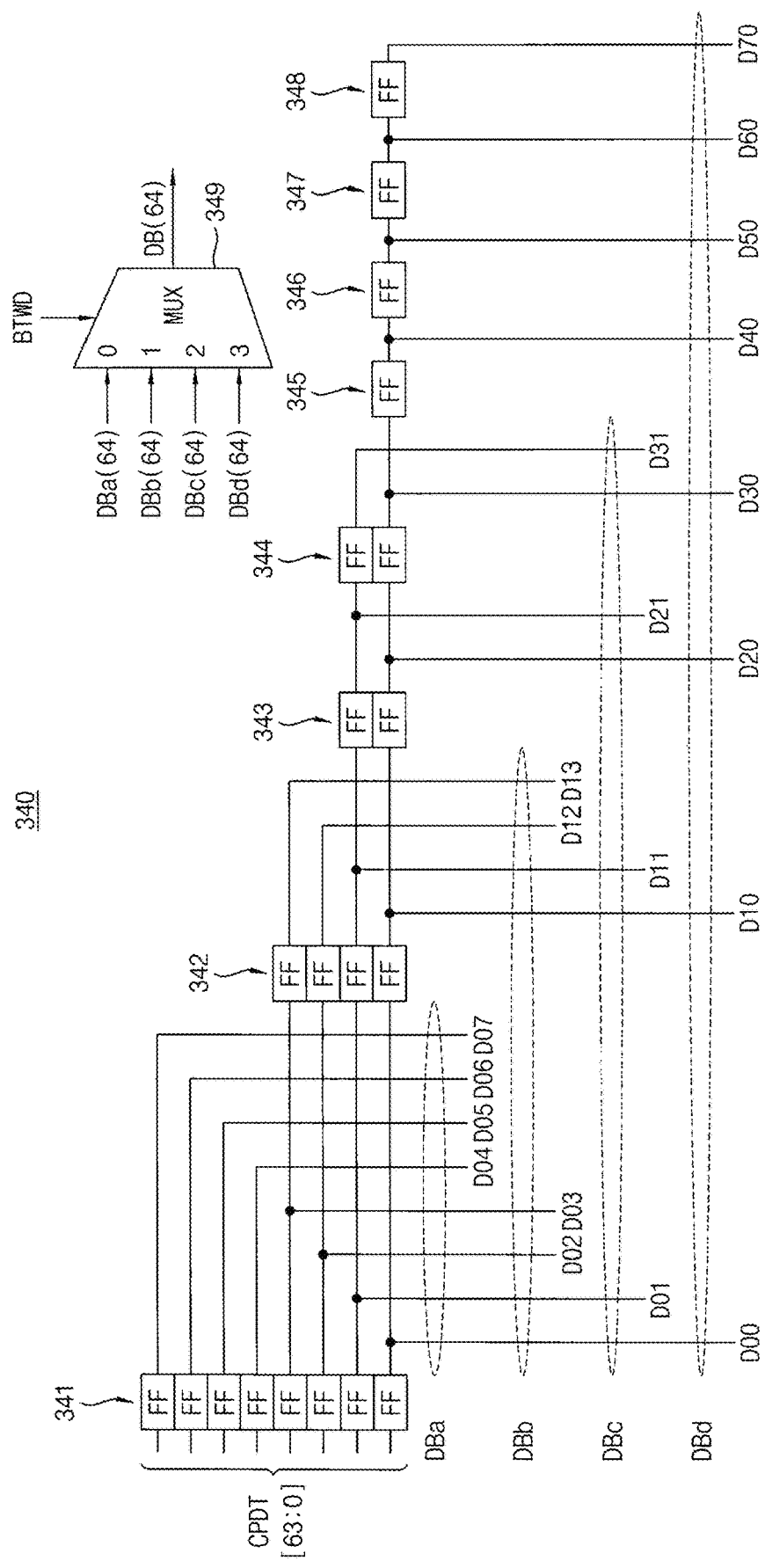
FIG. 18 is a diagram illustrating a data extractor included in the packer of FIG. 16 according to at least some example embodiments of the inventive concepts.
Figures 19, 20:
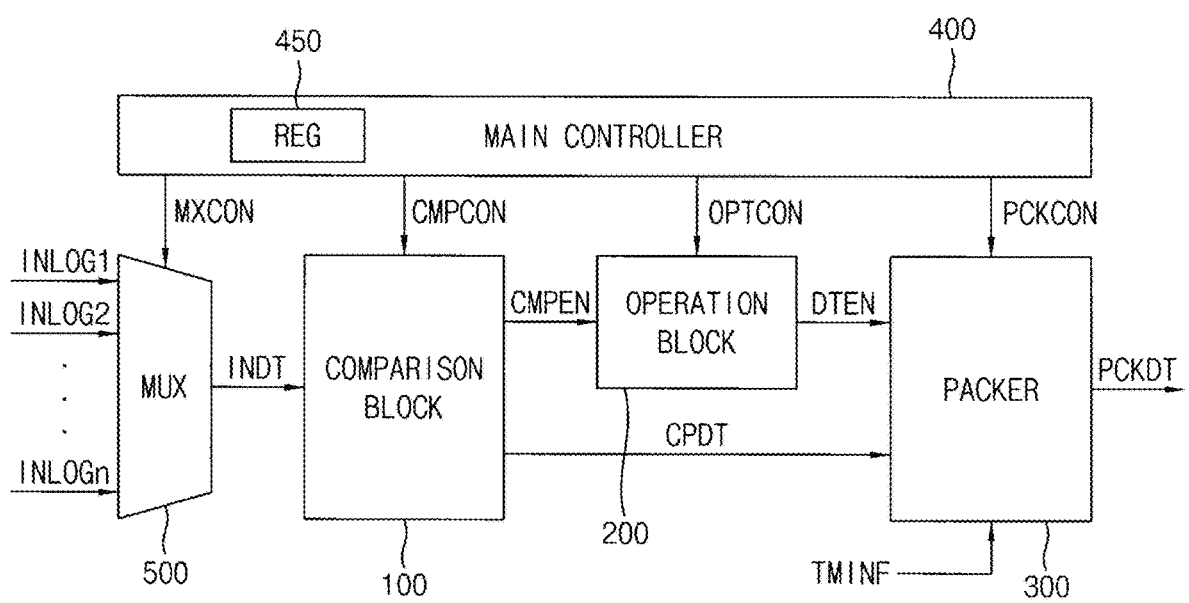
FIG. 19 is a diagram illustrating data signals generated by the data extractor of FIG. 18 according to at least some example embodiments of the inventive concepts.
FIG. 20 is a block diagram illustrating an embedded logic analyzer according to at least some example embodiments of the inventive concepts.

FIG. 18 is a diagram illustrating a data extractor included in the packer of FIG. 16 according to at least some example embodiments of the inventive concepts, and FIG. 19 is a diagram illustrating data signals generated by the data extractor of FIG. 18 according to at least some example embodiments of the inventive concepts.

Referring to FIG. 18, a data extractor 340 may include a plurality of flip-flop sets 341~348 and a multiplexer 349. FIG. 18 illustrates an example for processing the capture data signal CPDT of 64 bits. However, at least some example embodiments of the inventive concepts are not limited to the example illustrated in FIG. 18, and and the configuration of the data extractor 340 may be changed variously, for example, depending on the bit number of the capture data signal CPDT. In FIG. 18, "FF" represents eight flip-flops corresponding to one-byte data.

The capture data in the capture data signal CPDT may be stored initially in the first flip-flop set 341. When the new capture data are input through the capture data signal CPDT, a portion of the data stored in the first flip-flop set 341 is shifted and stored to the second flip-flop set 342 and the new capture data are stored in the first flip-flop set 341. In this way, the oldest capture data are stored in the eighth flip-flop set 348 and the most recent capture data may be stored in the first flip-flop set 341. The shifting operation between the flip-flop sets 341~348 may be performed in synchronization with the data enable signal DTEN representing the data capture timing.

The 64 bits D00~D07 from the first flip-flop set 341 may form a first data bit signal DBa, the 64 bits D00-D03 and D10~D13 from the first and second flip-flop sets 341 and 342 may form a second data bit signal DBb, the 64 bits D00, D01, D10, D11, D20, D21, D30 and D31 from the first through fourth flip-flop sets 341~344 may form a third data bit signal DBc, and the 64 bits D00, D10, D20, D30, D40, D50, D60 and D70 from the first through eighth flip-flop sets 341~348 may form a fourth data bit signal DBd. The first through eighth data bit signals DBa, DBb, DBc and DBd formed as such are illustrated in FIG. 19.

The multiplexer 349 may select one of the first through fourth data bit signals DBa, DBb, DBc and DBd in response to a bit width signal BTWD from the main controller 400 in FIG. 2 and output the selected one ad the data bit signal DB.

As such, the packer 340 may adjust a bit number that is captured for the capture data among an entire bit number of the capture data signal CPDT in response to the bit width signal BTWD. For example, as illustrated in FIGS. 18 and 19, the entire bit number of the capture data signal CPDT may be 64. The entire 64 bits may be captured when the first data bit signal DBa is selected, the 32 bits among the entire 64 bits may be captured when the second data bit signal DBb is selected, the 16 bits among the entire 64 bits may be captured when the third data bit signal DBc is selected, and the 8 bits among the entire 64 bits may be captured when the fourth data bit signal DBd is selected.

When a portion of the entire bits of the capture data signal CPDT is meaningful and required for debugging, only the portion of the entire bits may be captured actually. Thus the traffic in the integrated circuit may be reduced and the limited memory capacity may be used efficiently.

As such, the embedded logic analyzer and the integrated circuit including the embedded logic analyzer according to at least some example embodiments of the inventive concepts may efficiently control collection of data required for debugging and thus debugging of the integrated circuit may be performed efficiently by overcoming limits to internal resources of the integrated circuit such as traffic amount of a main bus, internal memory capacity, etc.

FIG. 20 is a block diagram illustrating an embedded logic analyzer according to at least some example embodiments of the inventive concepts.

Referring to FIG. 20, an embedded logic analyzer 51 may include the comparison block 100, the operation block 200, the packer 300, the main controller 400 and an input selector 500.

The input selector 500 may select one of logic signals INLOG1~INLOGn from the function blocks included in the integrated circuit 10 of FIG. 1 to provide the selected one as the input data signal INDT. The input selector 500 may be implemented with a multiplexer MUX that performs a selection operation in response to a selection control signal MXCON from the main controller 400.

The comparison block 100 may generate a capture data signal CPDT and a plurality of comparison enable signals CMPEN based on an input data signal INDT. The comparison enable signals CMPEN may be activated respectively in different comparison conditions. The input data signal INDT may be provided from the one function block directly connected to the embedded logic analyzer 50 as illustrated in FIG. 1. The input data signal INDT may be a parallel signal including multiple bits. The main controller 400 may generate comparison control signals CMPCON representing the comparison conditions to control the comparison block 100. The comparison control signals CMPCON may include the shift control signals SFT, the reference data signals CMPVL and the selection signals CMPMX as described above with reference to FIGS. 3 through 6.

The operation block 200 may receive the comparison enable signals CMPEN and perform a logic operation on the comparison enable signals CMPEN to generate a data enable signal DTEN indicating the data capture timing. The main controller 400 may generate operation control signals OPTCON representing the logic operation to control the operation block 200. The operation control signals OPTCON may include the start trigger signal STROP, the end trigger control signal ETROP, the write enable control signal WENOP, the time control signal TMCON and the selection signal CNTOPT as described with reference to FIGS. 7 through 13.

The packer 300 may receive the capture data signal CPDT from the comparison block 100 and the data enable signal DTEN from the operation block 200. The packer 300 may generate a packer data signal PCKDT including capture data and capture time information based on the capture data signal CPDT, the data enable signal DTEN and a time information signal TMINF. The main controller 400 may generate packer control signals PCKCON to control the operation of the packer 300. The packer control signals PCKCON may include the time size signal TMSZ, the time period signal TMPD and the bit width signal BTWD as described below with reference to FIGS. 14 through 19.

The main controller 400 may include a register REG 450 storing control values and generate the signals CMPCON, OPTCON and PCKCON based on the stored values in the register 450. When a problem occurs in the integrated circuit 10, the control values may be set to be suitable for required debugging. Through setting of the control values, the start and end time points of the data capture duration, the data capture timing, selection of the capture data, combination of the capture time information, etc. may be controlled efficiently. For ease of description, FIG. 2 is explained with reference to an example in which the main controller 400 is included in the embedded logic analyzer 50. However, at least some example embodiments of the inventive concepts are not limited to the examples illustrated in FIG. 2, and the main controller 400 may be included in other function blocks including, for example, a processor.

As such, the embedded logic analyzer 51 and the integrated circuit including the embedded logic analyzer 51 according to at least some example embodiments of the inventive concepts may efficiently control collection of data required for debugging and thus debugging of the integrated circuit may be performed efficiently by overcoming limits to internal resources of the integrated circuit such as traffic amount of a main bus, internal memory capacity, etc.

Figure 21A:
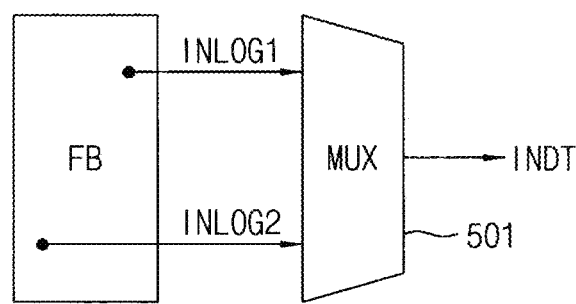
FIGS. 21A and 21B are diagrams illustrating provision of logic signals according to at least some example embodiments of the inventive concepts.
Figure 21B:
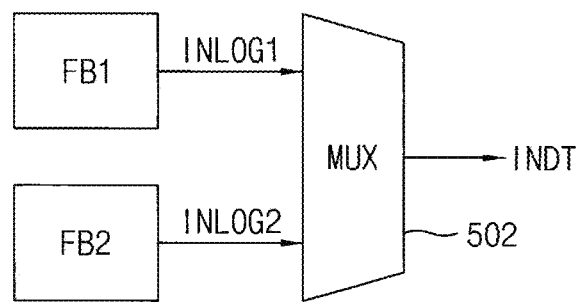

FIGS. 21A and 21B are diagrams illustrating provision of logic signals according to at least some example embodiments of the inventive concepts.

In at least some example embodiments of the inventive concepts, as illustrated in FIG. 21A, an input selector 501 may receive logic signals INLOG1 and INLOG2 from the same function block FB and provide one of the logic signals INLOG1 and INLOG2 as the input data signal INDT. In at least some other example embodiments of the inventive concepts, as illustrated in FIG. 21B, an input selector 502 may receive logic signal INLOG1 and INLOG2 from different function blocks FB1 and FB2 and provide one of the logic signals INLOG1 and INLOG2 as the input data signal INDT. As such, the data collection may be performed selectively for one of a plurality of logic signals using the common embedded logic analyzer and thus the data collection and debugging may be performed further efficiently. The function blocks FB illustrated in FIGS. 21A and 21B may each by embodied by circuits or circuitry.

Figure 22:
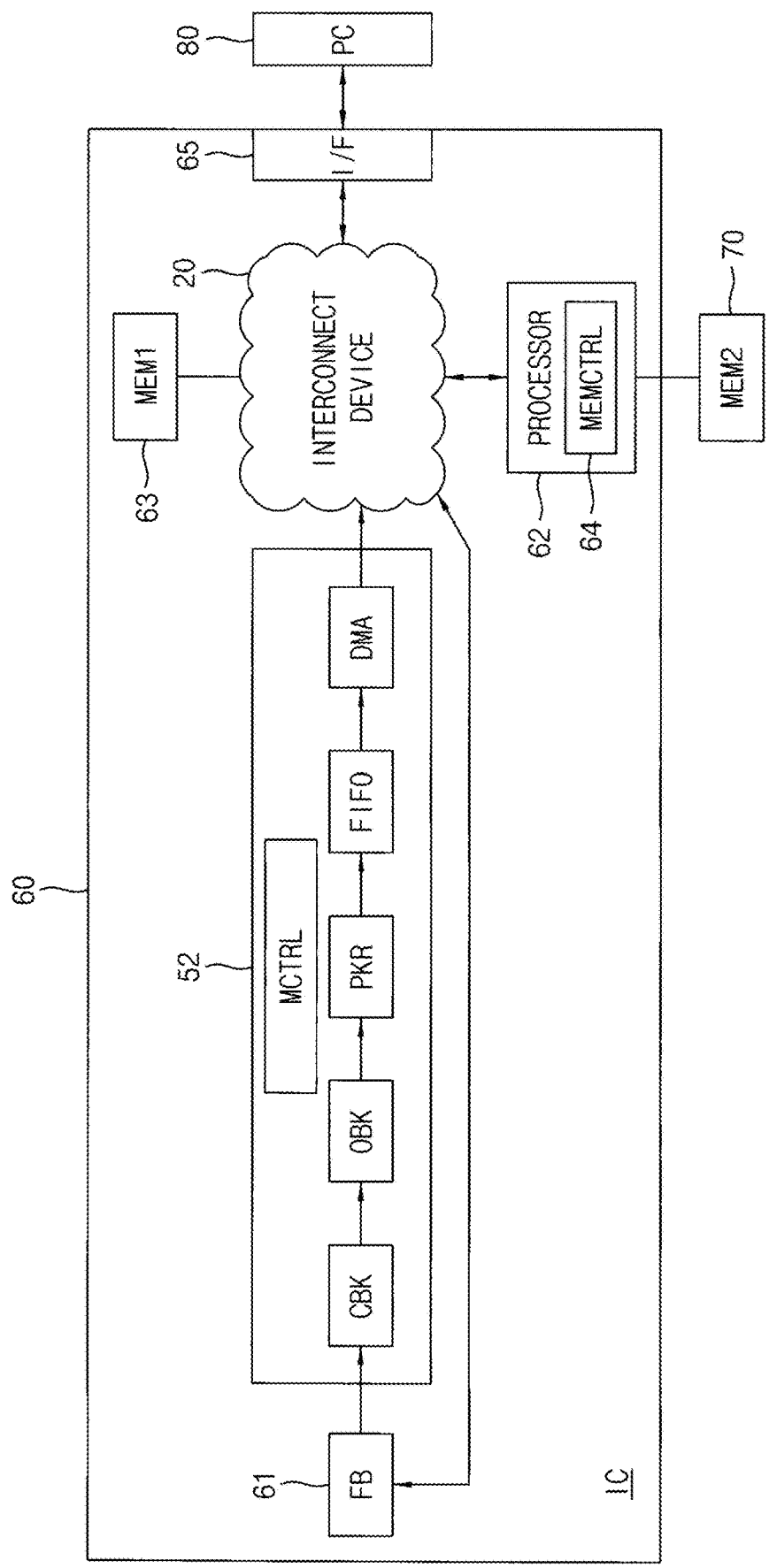
FIG. 22 is a block diagram illustrating an integrated circuit according to at least some example embodiments of the inventive concepts.

FIG. 22 is a block diagram illustrating an integrated circuit according to at least some example embodiments of the inventive concepts.

Referring to FIG. 22, an integrated circuit IC 60 may include an interconnect device 20, a plurality of function blocks FB 61, 62 and 63 connected to the interconnect device 20 and an embedded logic analyzer ELA 52 directly connected to at least one of the function blocks 61, 62 and 63. The interconnect device 20, plurality of function blocks FB 61, 62 and 63, and embedded logic analyzer ELA 52 may each be embodied by circuits or circuitry. Also the embedded logic analyzer 52 may be connected to the interconnect device 20. The embedded logic analyzer 52 may be integrated together with the function blocks 61, 62 and 63 and the interconnect device 20 in the same semiconductor die. As illustrated in FIG. 22, the function blocks 61, 62 and 63 may include a processor 62 and an embedded memory MEM1 63.

The embedded logic analyzer 52 may include a comparison block CBK, an operation block OBK, a packer PKR, a buffer FIFO and a direct memory access controller DMA each of which may each be embodied by circuits or circuitry. In comparison with the configuration of FIG. 2, the embedded logic analyzer 52 may further include the buffer FIFO and the direct memory access controller DMA. Accordingly, the embedded logic analyzer 52 may have the same structure as the embedded logic analyzer 50, with the exception that the embedded logic analyzer 52 additionally includes the buffer FIFO and the direct memory access controller DMA. The buffer FIFO may store data of the packer data signal from the packer PKR. The direct memory access controller DMA may transfer the data stored in the buffer FIFO to the embedded memory 63 included in the integrated circuit 60. In addition, the direct memory access controller DMA may transfer the data stored in the buffer FIFO to an external memory MEM2 70 outside of the integrated circuit 60. Further the direct memory access controller DMA may transfer the data stored in the buffer FIFO to an external device such as a personal computer PC 80 through an external high-speed interface I/F 65 such as a universal serial bus (USB), a PCI-Express, etc. The direct memory access controller DMA may be connected to the embedded memory 63, a memory controller 64 and/or the external high-speed interface 65 through the interconnect device 20. As illustrated in FIG. 22, the memory controller 64 may be included in the processor 62.

Figure 23:
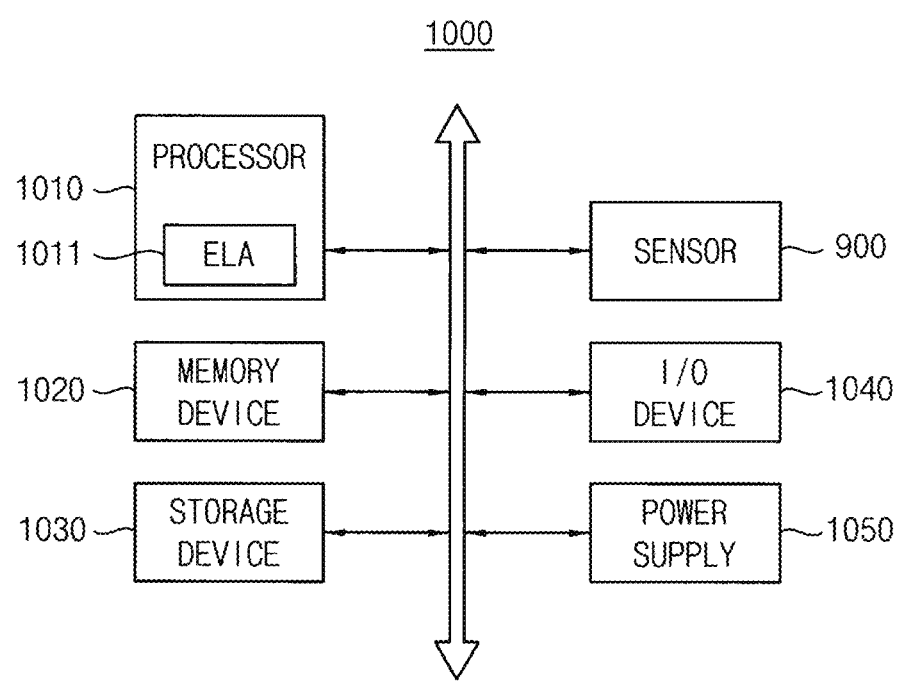
FIG. 23 is a block diagram illustrating a computer system including a video encoder according to at least some example embodiments of the inventive concepts.

FIG. 23 is a block diagram illustrating a computer system including a video encoder according to at least some example embodiments of the inventive concepts.

Referring to FIG. 23, a computing system 1000 may include a processor 1010, a memory device 1020, a storage device 1030, an input/output device 1040, a power supply 1050, and an image sensor 900. Although not illustrated in FIG. 23, the computing system 1000 may further include ports that communicate with a video card, a sound card, a memory card, a universal serial bus (USB) device, and/or other electronic devices.

The processor 1010 may perform various calculations or tasks. The processor 1010 may include an embedded logic analyzer ELA 1011. The embedded logic analyzer 1011 may have a configuration for efficiently controlling the collection of data required for debugging as described with reference to FIGS. 1 through 22. For example, the ELA 1011 may have the same structure and operation described above with respect to the ELA 50, the ELA 51 or the ELA 52. According to some embodiments, the processor 1010 may be, for example, a microprocessor or a central processing unit (CPU). The processor 1010 may communicate with the memory device 1020, the storage device 1030, and the input/output device 1040 via an address bus, a control bus, and/or a data bus. In at least some example embodiments of the inventive concepts, the processor 1010 may be coupled to an extended bus, such as a peripheral component interconnection (PCI) bus. The memory device 1020 may store data for operating the computing system 1000. For example, the memory device 1020 may be implemented using a dynamic random access memory (DRAM) device, a mobile DRAM device, a static random access memory (SRAM) device, a phase random access memory (PRAM) device, a ferroelectric random access memory (FRAM) device, a resistive random access memory (RRAM) device, and/or a magnetic random access memory (MRAM) device. The storage device may include a solid state drive (SSD), a hard disk drive (HDD), a compact-disc read-only memory (CD-ROM), etc. The input/output device 1040 may include an input device (e.g., a keyboard, a keypad, a mouse, etc.) and an output device (e.g., a printer, a display device, etc.). The power supply 1050 supplies operation voltages for the computing system 1000.

The image sensor 900 may communicate with the processor 1010 via the buses or other communication links. The image sensor 900 may be integrated with the processor 1010 in one chip, or the image sensor 900 and the processor 1010 may be implemented as separate chips.

The computing system 1000 may be packaged according to any one or more of a large variety of packaging technologies, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline integrated circuit (SOIC), shrink small outline package (SSOP), thin small outline package (TSOP), system in package (SIP), multi-chip package (MCP), wafer-level fabricated package (WFP), or wafer-level processed stack package (WSP).

The computing system 1000 may be any computer system from among a variety of different computing systems and include an embedded logic analyzer according to at least some example embodiments of the inventive concepts. For example, the computing system 1000 may include a digital camera, a mobile phone, a smart phone, a portable multimedia player (PMP), a personal digital assistant (PDA), etc.

Figure 24:
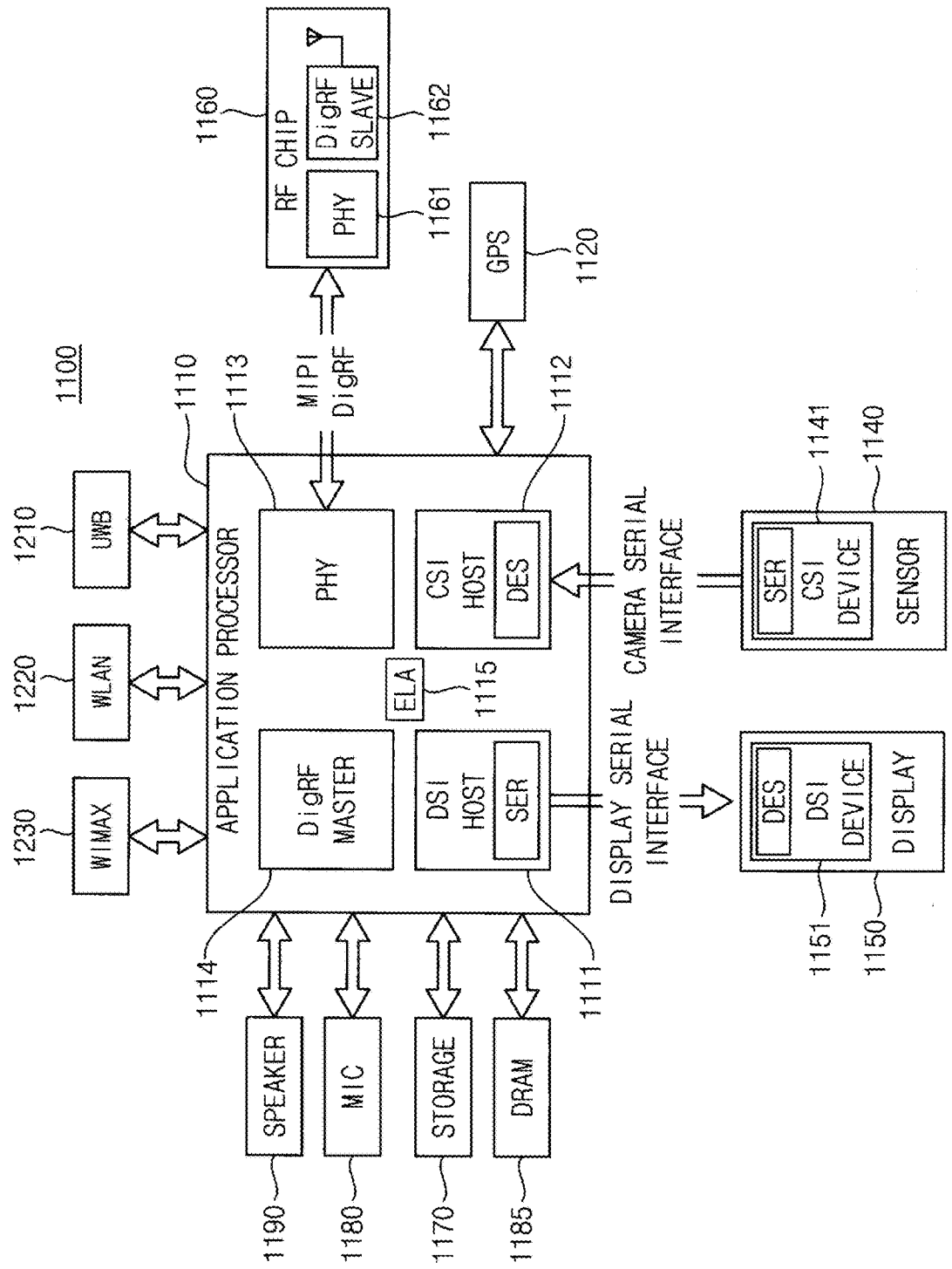
FIG. 24 is a block diagram illustrating an interface employable in the computing system of FIG. 23 according to at least some example embodiments of the inventive concepts.

FIG. 24 is a block diagram illustrating an interface employable in the computing system of FIG. 23 according to at least some example embodiments of the inventive concepts.

Referring to FIG. 24, a computing system 1100 may be implemented by a data processing device that uses or supports a mobile industry processor interface (MIPI®) interface. The computing system 1100 may include an application processor 1110, an image sensor 1140, a display device 1150, etc. A CSI host 1112 of the application processor 1110 may perform serial communication with a CSI device 1141 of the image sensor 1140 via a camera serial interface (CSI). In at least some example embodiments of the inventive concepts, the CSI host 1112 may include a deserializer (DES), and the CSI device 1141 may include a serializer (SER). A DSI host 1111 of the application processor 1110 may perform serial communication with a DSI device 1151 of the display device 1150 via a display serial interface (DSI).

In at least some example embodiments of the inventive concepts, the DSI host 1111 may include a serializer (SER), and the DSI device 1151 may include a deserializer (DES). The computing system 1100 may further include a radio frequency (RF) chip 1160 performing a communication with the application processor 1110. A physical layer (PHY) 1113 of the computing system 1100 and a physical layer (PHY) 1161 of the RF chip 1160 may perform data communications based on a MIPI® DigRFSM. The application processor 1110 may further include a DigRFSM MASTER 1114 that controls the data communications of the PHY 1161.

The processor 1010 may include an embedded logic analyzer ELA 1115. The embedded logic analyzer 1115 may have a configuration for efficiently controlling the collection of data required for debugging as described with reference to FIGS. 1 through 22. For example, the ELA 1115 may have the same structure and operation described above with respect to the ELA 50, the ELA 51 or the ELA 52.

The computing system 1100 may further include a global positioning system (GPS) 1120, a storage 1170, a MIC 1180, a DRAM device 1185, and a speaker 1190. In addition, the computing system 1100 may perform communication using an ultra-wideband (UWB) 1210, a wireless local area network (WLAN) 1220, a worldwide interoperability for microwave access (WIMAX) 1230, etc. However, the structure and the interface of the computing system 1100 are not limited thereto.

As will be appreciated by those skilled in the art, example embodiments of inventive concepts may be embodied as a system, method, computer program product, and/or a computer program product embodied in one or more computer readable medium(s) having computer readable program code embodied thereon. The computer readable program code may be provided to a processor of a general purpose computer, special purpose computer, or other programmable data processing apparatus. The computer readable medium may be a computer readable signal medium or a computer readable storage medium. The computer readable storage medium may be any tangible medium that can contain, or store a program for use by or in connection with an instruction execution system, apparatus, or device.

The present disclosure may be applied to arbitrary devices and systems including an embedded logic analyzer for debugging arbitrary integrated circuits. For example, the present disclosure may be applied to systems such as be a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

Example embodiments of the inventive concepts having thus been described, it will be obvious that the same may be varied in many ways. Such variations are not to be regarded as a departure from the intended spirit and scope of example embodiments of the inventive concepts, and all such modifications as would be obvious to one skilled in the art are intended to be included within the scope of the following claims.

What is claimed is:

1. An embedded logic analyzer of an integrated circuit, comprising:
a comparison block configured to generate a capture data signal and a plurality of comparison enable signals based on an input data signal from one of function blocks included in the integrated circuit such that the comparison enable signals are activated respectively based on different comparison conditions, the comparison block including a first comparison circuit, a second comparison circuit and a third comparison circuit, the first comparison circuit is configured to
shift one of the input data signal or a first shift data signal from the second comparison circuit to generate a second shift data signal, and compare the second shift data signal with one of a reference data signal or a third shift data signal from the third comparison circuit to generate the comparison enable signal generated by the first comparison circuit;

an operation block configured to generate a data enable signal indicating a data capture timing; and packer circuitry configured to generate a packer data signal.

2. The embedded logic analyzer of claim 1, wherein the operation block includes:

first operation circuitry configured to generate a start trigger enable signal based on the comparison enable signals and a start trigger control signal;

second operation circuitry configured to generate an end trigger enable signal based on the comparison enable signals and an end trigger control signal; and third operation circuitry configured to generate a write enable signal based on the comparison enable signals and a write enable control signal.

3. The embedded logic analyzer of claim 2, wherein each of the first operation circuitry, the second operation circuitry and the third operation circuitry includes:

a plurality of multiplexers configured to output first selected signals selected from among the comparison enable signals such that the first selected signals correspond to the portion of the comparison enable signals, in response to each of the start trigger control signal, the end trigger control signal and the write enable control signal; and operator circuitry configured to perform a logic operation on the first selected signals in response to each of the start trigger control signal, the end trigger control signal and the write enable control signal to generate each of the start trigger enable signal, the end trigger enable signal and the write enable signal.

4. The embedded logic analyzer of claim 3, wherein the operator circuitry performs different logic operations on the first selected signals to provide different results of the different logic operation, and the operator circuitry selects one of the different results to output each of the start trigger enable signal, the end trigger enable signal and the write enable signal.

5. The embedded logic analyzer of claim 2, wherein the operation block further includes:

a time controller configured to generate a write-on signal indicating start and end time points of data capture duration in response to the start trigger enable signal, the end trigger enable signal and a time control signal; and a logic gate configured to generate the data enable signal based on the write-on signal and the write enable signal.

6. The embedded logic analyzer of claim 5, wherein the data enable signal is activated in synchronization with the write enable signal when the write-on signal is activated such that data capture is inhibited when the write-on signal is deactivated.

7. The embedded logic analyzer of claim 5, wherein the logic gate is implemented as an AND gate.

8. The embedded logic analyzer of claim 5, wherein the time controller includes:

a first logic circuit configured to generate a write start signal indicating the start time point of the data capture duration;

a second logic circuit configured to generate a write end signal indicating the end time point of the data capture duration;

an internal timer configured to provide a relative time of the data capture; and a counter configured to count activation numbers of the start trigger enable signal and the end trigger enable signal.

9. The embedded logic analyzer of claim 7, wherein the time controller is configured to activate the write start signal and the write end signal in response to a start control signal and an end control signal, respectively, the start control signal and the end control signal being signals provided from an external circuit outside of the time controller.

10. The embedded logic analyzer of claim 7, wherein the time controller is configured to, activate the write start signal based on a system time from a system timer and a reference start time, and activate the write end signal based on the system time and a reference end time.

11. The embedded logic analyzer of claim 7, wherein the time controller is configured to, count a first number of activations of the start trigger enable signal after a start control signal provided from an external circuit outside of the time controller is activated, activate the write start signal based on the first number of activations, count a second number of activations of the end trigger enable signal after an end control signal provided from the external circuit is activated, and activate the write end signal based on each of the second number of activations.

12. The embedded logic analyzer of claim 7, wherein the time controller is configured to, count a first number of activations of the start trigger enable signal after a system time from a system timer coincides with a reference start time, activate each the write start signal based on the first number of activations, count a second number of activations of the end trigger enable signal after a system time from a system timer coincides with a reference end time, and activate the write end signal based on the second number of activations.

13. The embedded logic analyzer of claim 2, wherein, the first operation circuitry is configured to vary the start trigger control signal based on a number of activations of the start trigger enable signal, and the second operation circuitry is configured to vary the end trigger control signal based on a number of activations of the end trigger enable signal.

14. The embedded logic analyzer of claim 1, further comprising:

input selector circuitry configured to select, as the input data signal, one of logic signals from the function blocks.

15. The embedded logic analyzer of claim 1, further comprising:

a buffer configured to store data of the packer data signal; and a direct memory access controller configured to transfer the data stored in the buffer to an embedded memory included in the integrated circuit or an external memory outside of the integrated circuit.

16. An integrated circuit comprising:
the embedded logic analyzer of claim 1;
interconnect circuitry; and the function blocks,
the function blocks being connected to the interconnect circuitry,
the embedded logic analyzer being directly connected to at least one of the function blocks.

17. An embedded logic analyzer included in an integrated circuit, comprising:
input selector circuitry configured to select as an input data signal one of logic signals from function blocks included in the integrated circuit and to provide the input data signal;
a comparison block configured to generate a capture data signal and a plurality of comparison enable signals based on the input data signal such that the comparison enable signals are activated respectively based on different comparison conditions, the comparison block including a first comparison circuit, a second comparison circuit and a third comparison circuit, the first comparison circuit configured to,
shift one of the input data signal and a first shift data signal from the second comparison circuit to generate a second shift data signal, and
compare the second shift data signal with one of a reference data signal and a third shift data signal from the third comparison circuit to generate the comparison enable signal generated by the first comparison circuit;
an operation block configured to select a portion of the comparison enable signals and perform a logic operation on the portion of the comparison enable signals to generate a data enable signal indicating a data capture timing;
packer circuitry configured to generate a packer data signal including capture data and capture time information based on the capture data signal, the data enable signal and a time information signal; and
a main controller configured to control operations of the input selector circuitry, the comparison block, the operation block and the packer circuitry.

18. The embedded logic analyzer of claim 17, wherein the operation block includes:
first operation circuitry configured to generate a start trigger enable signal based on the comparison enable signals and a start trigger control signal;
second operation circuitry configured to generate an end trigger enable signal based on the comparison enable signals and an end trigger control signal;
third operation circuitry configured to generate a write enable signal based on the comparison enable signals and a write enable control signal;
a time controller configured to generate a write-on signal indicating start and end time points of data capture duration in response to the start trigger enable signal, the end trigger enable signal and a time control signal; and
a logic gate configured to generate the data enable signal based on the write-on signal and the write enable signal.

19. An embedded logic analyzer, comprising:
first circuitry configured to, generate a capture data signal and first enable signals;
second circuitry configured to generate a packer data signal including debugging information of an integrated circuit;
an operation block,
configured to generate a data enable signal indicating a data capture timing;
data extractor circuitry configured to generate a data bit signal of a fixed bit number based on the capture data signal;
time information circuitry configured to generate a time information bit signal of the fixed bit number based on a time information signal; and
a multiplexer configured to selectively output one of the data bit signal and the time information bit signal as the packer data signal based on a time period signal,
wherein the second circuitry is configured to generate the packer data signal based on the data enable signal, the capture data signal, and the time information signal.

* * * * *